(12) United States Patent
Miyazawa et al.

(10) Patent No.: US 11,264,314 B2
(45) Date of Patent: Mar. 1, 2022

(54) INTERCONNECTION WITH SIDE CONNECTION TO SUBSTRATE

(71) Applicant: INTERNATIONAL BUSINESS MACHINES CORPORATION, Armonk, NY (US)

(72) Inventors: Risa Miyazawa, Kanagawa (JP); Takahito Watanabe, Kanagawa (JP); Hiroyuki Mori, Shiga-ken (JP); Keishi Okamoto, Kanagawa (JP)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 118 days.

(21) Appl. No.: 16/585,299

(22) Filed: Sep. 27, 2019

(65) Prior Publication Data
US 2021/0098349 A1    Apr. 1, 2021

(51) Int. Cl.
*H01L 23/498* (2006.01)
*H01L 23/538* (2006.01)
*H01L 21/48* (2006.01)
*H01L 23/00* (2006.01)
*H01L 21/683* (2006.01)

(52) U.S. Cl.
CPC ...... *H01L 23/49811* (2013.01); *H01L 21/481* (2013.01); *H01L 21/4853* (2013.01); *H01L 21/6835* (2013.01); *H01L 23/49838* (2013.01); *H01L 23/5386* (2013.01); *H01L 24/16* (2013.01); *H01L 2221/68359* (2013.01); *H01L 2224/16227* (2013.01)

(58) Field of Classification Search
CPC ......... H01L 23/49811; H01L 23/49838; H01L 23/5386; H01L 21/6385; H01L 21/4853
See application file for complete search history.

(56) References Cited

U.S. PATENT DOCUMENTS

| | | |
|---|---|---|
| 5,241,456 A | 8/1993 | Marcinkiewicz et al. |
| 6,063,481 A | 5/2000 | Arrington et al. |
| 8,198,546 B2 | 6/2012 | Kawamura et al. |
| (Continued) | | |

FOREIGN PATENT DOCUMENTS

| | | |
|---|---|---|
| CN | 106298714 B | 2/2019 |
| JP | 2012-209418 A | 10/2012 |
| KR | 1020140087541 A | 7/2014 |

OTHER PUBLICATIONS

Anonymous, "How do I prevent bridges while soldering SMD Components?" Jul. 2017, 1 page, https://electronics.stackexchange.com/questions/1848/custom-led-assembly-manufacturing/3181#3181.

(Continued)

*Primary Examiner* — Jasmine J Clark
(74) *Attorney, Agent, or Firm* — Tutunjian & Bitetto, P.C.; Randall Bluestone

(57) ABSTRACT

An interconnection structure is disclosed. The interconnection structure includes a base substrate, a set of conductive pads disposed on the base substrate and an interconnection layer disposed on the base substrate. The interconnection layer has an edge located next to the set of the conductive pads and includes a set of side connection pads located and disposed at the edge of the interconnection layer. Each side connection pad is arranged with respect to a corresponding one of the conductive pads disposed on the base substrate.

9 Claims, 22 Drawing Sheets

(56) References Cited

U.S. PATENT DOCUMENTS

| | | | |
|---|---|---|---|
| 8,901,431 | B2 | 12/2014 | Nishioka et al. |
| 8,997,341 | B2 | 4/2015 | Ejiri et al. |
| 9,240,382 | B2 | 1/2016 | Hollis |
| 9,914,989 | B2 | 3/2018 | Kay et al. |
| 10,163,798 | B1 | 12/2018 | Alur et al. |
| 10,197,423 | B2 | 2/2019 | Lindballe |
| 10,249,593 | B2 | 4/2019 | Wickramanayaka et al. |
| 10,361,170 | B2 | 7/2019 | Pyo et al. |
| 2008/0149369 | A1 | 6/2008 | Kawamura et al. |
| 2012/0152600 | A1 | 6/2012 | Nishioka et al. |
| 2014/0145328 | A1 | 5/2014 | Tummala et al. |
| 2016/0095219 | A1 | 3/2016 | Sakamoto et al. |
| 2017/0045387 | A1 | 2/2017 | Lindballe |
| 2017/0053897 | A1* | 2/2017 | Lai ................ H01L 23/5389 |
| 2017/0236724 | A1 | 8/2017 | Chang et al. |
| 2018/0182707 | A1 | 6/2018 | Elsherbini et al. |
| 2018/0190577 | A1 | 7/2018 | Gupta et al. |
| 2019/0051603 | A1 | 2/2019 | Horibe et al. |
| 2019/0051605 | A1 | 2/2019 | Horibe et al. |
| 2019/0148250 | A1* | 5/2019 | Yu ................ H01L 23/5383 257/773 |
| 2020/0100369 | A1 | 3/2020 | Martin et al. |

OTHER PUBLICATIONS

Yamamoto, Michitaka, et al., "Comparison of Argon and Oxygen Plasma Treatments for Ambient Room-Temperature Wafer-Scale Au—Au Bonding Using Ultrathin Au Films," Micromachines, Feb. 2019, 12 pages, 10, 2.

Anonymous, "Kawai Laboratory, Nano/Micro System Engineering Laboratory," Department of Electrical, Electronic and Information Engineering, Nagaoka University of Technology Electronic Device and Photonics Engineering Course, Sep. 2019, 56 pages, http://kawai.nagaokaut.ac.jp/miniseminar2.html.

International Search Report issued in International Application No. PCT/IB2020/057965 dated Nov. 27, 2020 pp. 1-9.

Notice of Allowance dated Jan. 6, 2021 for U.S. Appl. No. 16/585,337, 14 pages.

* cited by examiner

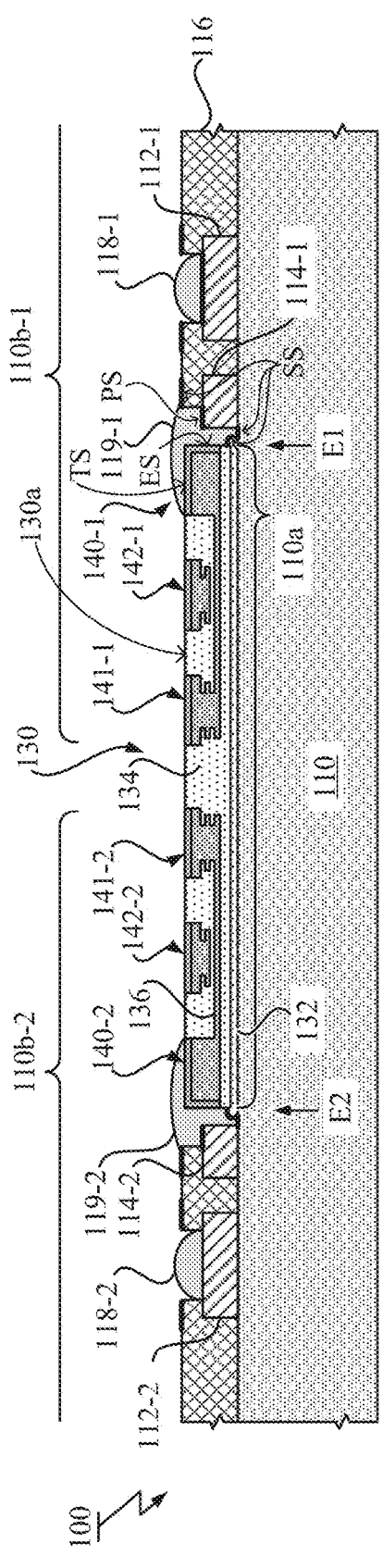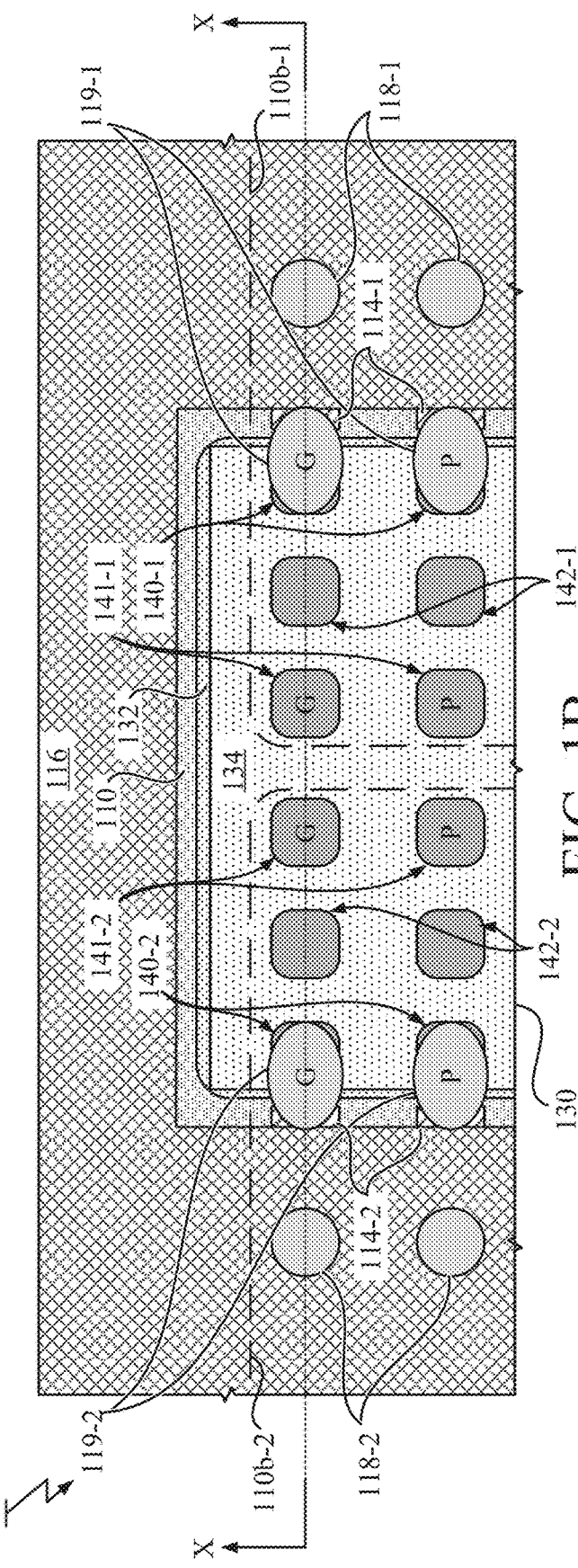
FIG. 1A
FIG. 1B

INTERCONNECTION WITH SIDE CONNECTION TO SUBSTRATE

BACKGROUND

The present disclosure, generally, relates to interconnection technology, more particularly, to an interconnection structure, an interconnection layer carrying structure and methods of fabricating thereof.

In response to growing demand for wide band signal transmission between chips (or dice), several technologies targeting high density interconnections between chips have been proposed.

Interconnection structures using an interconnection member attached to or embedded in an organic substrate have been developed for establishing interconnections between chips mounted thereon. Examples of such interconnection member disposed on the organic substrate include a silicon bridge and an organic layered interconnection. Use of such interconnection member can often restrict routing of wiring for connecting chips and for driving the chips. Terminal layout of the chips can also be restricted. For example, even though it is preferable to arrange the ground and power supply terminals of the chip at positions above the interconnection member, it is often difficult to route wiring from the power and ground terminals of the chip to external power supply and ground lines of the organic substrate.

SUMMARY

According to an embodiment of the present invention, an interconnection structure is provided. The interconnection structure includes a base substrate, a set of conductive pads disposed on the base substrate and an interconnection layer disposed on the base substrate. The interconnection layer has an edge located next to the set of the conductive pads and includes a set of side connection pads located and exposed at the edge of the interconnection layer, in which each side connection pad is arranged with respect to a corresponding one of the conductive pads disposed on the base substrate.

The interconnection structure according to the embodiment of the present invention allows us to introduce a novel side connection between the conductive pad of the base substrate and the side connection pad of the interconnection layer. Introduction of the novel side connection improves flexibility for routing of wiring with the interconnection layer. Thereby, it is possible to improve performance of an electronic device using the interconnection structure since the wiring can be optimized according to the improved routing flexibility. Also, it relaxes constraints on terminal layout of a chip that uses the interconnection layer.

In a preferable embodiment, each side connection pad has a top surface exposed at a top surface of the interconnection layer and an edge surface exposed at the edge of the interconnection layer, in which the edge surface faces toward the corresponding one of the conductive pads. Thereby, it is possible to improve reliability of the side connection and a manufacturing yield since both the edge surface and the top surface are involved in the side connection to increase a contact area.

In a further preferable embodiment, the edge surface and/or the top surface of each side connection pad have a barrier metal. Thereby, it is possible to improve reliability of the side connection.

In further other preferable embodiment, the interconnection layer further includes insulation material giving the top surface of the interconnection layer and a set of first bond pads exposed from the insulation material at the top surface of the interconnection layer. The set of the first bond pads is used for mounting a chip. Each first bond pad is connected to a corresponding one of the side connection pads via wiring embedded into the insulation material. Thereby, it is possible to introduce an electrical connection between a chip that is mounted on the base substrate and other component of the base substrate via the first bond pads and the side connections.

In a particular embodiment, the interconnection layer further includes a second bond pad for mounting the chip and a third bond pad for mounting other chip, in which the second bond pad is connected to the third bond pad via a trace embedded into the insulation material. Thereby, inexpensive, reliable high density interconnections with novel side connections are provided between chips to be mounted thereon.

In a preferable embodiment, the edge of the interconnection layer has one or more curved or angular shapes to extend the length thereof and the set of the side connection pads and the set of the conductive pads are formed along a contour of the one or more curved or angular shapes. Thereby, it is possible to increase density of the side connections and/or contact areas for the side connections.

In a preferable embodiment, each pair of one side connection pad of the interconnection layer and one corresponding conductive pad disposed on the base substrate is used for power supply or ground, independently. Thereby, it permits suppression of voltage drop in comparison with a case where routing of the wiring on the base substrate is conducted while avoiding an area of the interconnection layer. Provision of a power supply or ground line that works as a signal return current path by using the interconnection layer is advantageous for high-speed signal transmission.

In a preferable embodiment, the base substrate has a top surface. Each conductive pad has a pad surface. The top surface of the base substrate and the pad surface of the each conductive pad have respective parts treated by a surface treatment for enhancing surface roughness. Thereby, it is possible to prevent the adjacent side connections from bridging and to improve reliability of the side connections even when pitches between the side connections become fine.

In a particular embodiment, the interconnection structure further includes a set of solder joints, each of which connects one side connection pad of the interconnection layer with one corresponding conductive pad disposed on the base substrate.

In other particular embodiment, the interconnection structure further includes one or more chips mounted on the base substrate, in which at least one of the chips has a terminal electrically connected to one of the conductive pads disposed on the base substrate through one of the side connection pads.

According to other embodiment of the present invention, an interconnection layer carrying structure is provided. The interconnection layer carrying structure includes a support substrate, a release layer formed on the support substrate and an interconnection layer part that is disposed on the release layer and has an edge. The interconnection layer part includes insulation material and a set of side connection pads embedded in the insulation material, in which the set of the side connection pads is located and exposed at the edge of the interconnection layer part and formed along the edge of the interconnection layer part with a predetermined interval.

The interconnection layer carrying structure according to other embodiment of the present invention can be used to transfer a precisely formed interconnection layer onto a substrate in order to fabricate the aforementioned interconnection structure. Provision of interconnection layer allows us to improve flexibility for routing of wiring with the interconnection layer and to relax constraints on terminal layout of a chip using the interconnection layer. Provision of the interconnection layer carrying structure reduces production cost and improve production yield of the interconnection structure.

According to further other embodiment of the present invention, a method for fabricating an interconnection structure is provided. The method includes providing a base substrate that includes a set of conductive pads disposed thereon. The method also includes disposing an interconnection layer on the base substrate, in which the interconnection layer includes a set of side connection pads located and exposed at an edge of the interconnection layer. The interconnection layer is disposed such that the edge of the interconnection layer is located next to the set of the conductive pads and each side connection pad is arranged with respect to a corresponding one of the conductive pads disposed on the base substrate.

The interconnection structure fabricated by the method according to the embodiment of the present invention allows us to introduce a novel side connection between the conductive pad of the base substrate and the side connection pad of the interconnection layer. Introduction of the novel side connection improves flexibility for routing of wiring with the interconnection layer. Thereby, it is possible to improve performance of an electronic device using the interconnection structure since the wiring can be optimized according to the improved routing flexibility. Also, it relaxes constraints on terminal layout of a chip that uses the interconnection layer.

In a preferable embodiment, the base substrate has a top surface and each conductive pad has a pad surface. The method further includes applying a surface treatment for enhancing surface roughness to both of at least a part of the top surface of the base substrate close to the conductive pads and the pad surface of each conductive pad so as to make at least the part of the top surface and the pad surface of each conductive pad rougher. Thereby, it is possible to prevent the adjacent side connections from bridging and to improve reliability of the side connections even if pitches between the side connections are fine.

In a particular embodiment, the disposing of the interconnection layer includes placing an interconnection layer carrying structure onto the base substrate in a upside down manner, in which the interconnection layer carrying structure includes a support substrate, a release layer on the support substrate and an interconnection layer part on the release layer. The disposing of the interconnection layer includes releasing the interconnection layer part from the support substrate by removing the release layer to provide the interconnection layer disposed on the base substrate.

According to another embodiment of the present invention, a method for fabricating an interconnection layer carrying structure is provided. The method includes preparing a support substrate. The method also includes applying a release layer on the support substrate. The method further includes building an interconnection layer part on the release layer. The interconnection layer part has an edge and includes insulation material and a set of side connection pads that are embedded in the insulation material. The set of the side connection pads is located and exposed at the edge of the interconnection layer part and formed along the edge of the interconnection layer part with a predetermined interval.

The interconnection layer carrying structure fabricated by the method according to the embodiment of the present invention can be used to transfer a precisely formed interconnection layer onto a substrate in order to fabricate the aforementioned interconnection structure. Provision of interconnection layer allows us to improve flexibility for routing of wiring with the interconnection layer and to relax constraints on terminal layout of a chip using the interconnection layer. Provision of the interconnection layer carrying structure reduces production cost and improve production yield of the interconnection structure.

In a particular embodiment, the building of the interconnection layer includes patterning conductive material to provide the set of the side connection pads on the release layer. The building of the interconnection layer further includes forming an insulation part on the release layer so as to embed the set of the side connection pads.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings. Note that the sizes and relative positions of elements and layers in the drawings are not necessarily drawn to scale. Some of these elements or layers are arbitrarily enlarged and positioned for improving legibility of drawing.

FIG. 1A illustrates a schematic of an interconnection substrate according to an exemplary embodiment of the present invention.

FIG. 1B illustrates a schematic of an interconnection substrate according to an exemplary embodiment of the present invention.

DETAILED DESCRIPTION

Figure 2:
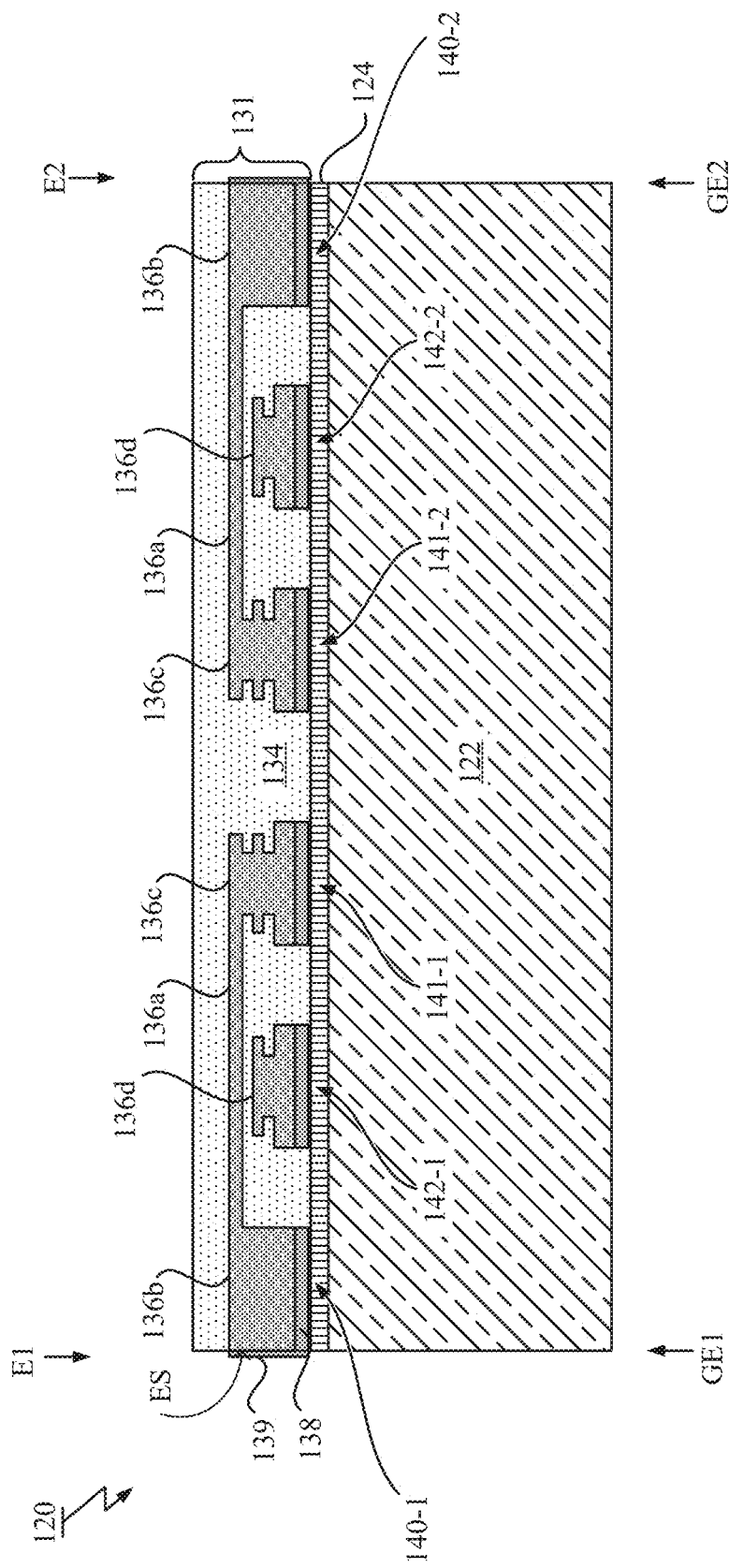
FIG. 2 illustrates a schematic of an interconnection layer carrying structure used for transferring an interconnection layer onto a target substrate according to an exemplary embodiment of the present invention.

Hereinafter, the present invention will be described with respect to particular embodiments, but it will be understood by those skilled in the art that the embodiments described below are mentioned only by way of examples and are not intended to limit the scope of the present invention.

One or more embodiments according to the present invention are directed to an interconnection structure, an interconnection layer carrying structure used for fabricating the interconnection structure, a method of fabricating the interconnection structure and a method of fabricating the interconnection layer carrying structure, in which the interconnection structure provides novel side connections between a base substrate and an interconnection layer disposed thereon in addition to high-density interconnections between chips mounted on the interconnection structure. When describing embodiments with reference to FIGS. 1A through 22B, a plurality of identical elements may be identified with a collective reference numeral while each individual element of the plurality may be identified by an individual index reference numeral appended to the collective reference numeral, for example, a plurality of bond pads shown in FIG. 1A are collectively referenced by numeral 112 and each individual bond pad is referenced by numeral 112-1 and 112-2.

Hereinafter, referring to FIG. 1A and FIG. 1B, a schematic of an interconnection structure before chip mounting according to an exemplary embodiment of the present invention is described.

FIG. 1A and FIG. 1B illustrate a schematic of an interconnection substrate 100 for interconnecting chips to be mounted thereon. The interconnection substrate 100 is an interconnection structure before the chip mounting. FIG. 1A and FIG. 1B show a cross-sectional view and a top view of the interconnection substrate 100, respectively. Note that the cross-sectional view shown in FIG. 1A corresponds to a cross-section indicated by "X" in the top view of FIG. 1B.

As shown in FIG. 1A, the interconnection substrate 100 includes an organic base substrate 110; a plurality of bond pads 112 used for chip bonding that is formed on the organic base substrate 110; a set of conductive pads 114 used for side connection that is formed on the organic base substrate 110; and an interconnection layer 130 disposed on the organic base substrate 110.

The organic base substrate 110 can be a build-up substrate having a core such as a glass epoxy core and an appropriate number of wiring layers with interlayer dielectrics, and can be fabricated by any build-up process. The bond pads 112 and the conductive pads 114 can be an outermost layer of the build-up substrate. Each bond pad 112 is connected to a signal line via the writing in the organic base substrate 110. Each conductive pad 114 is connected to a power supply or ground line that can work as a signal return current path, which is a path the current takes to return to the source, via the writing in the organic base substrate 110. The bond pads 112, the conductive pads 114 and wiring are made of any one of metal materials (e.g., Cu, Al, etc.) and other conductive materials. In a particular embodiment, metal copper can be used. Note that an internal structure inside the organic base substrate 110 is omitted from the drawings for a purpose of illustration. Also note that the organic base substrate 110 is employed as a base substrate in the described embodiment. However, an inorganic substrate such as a glass substrate can also be employed as the base substrate.

In a particular embodiment, the interconnection substrate 100 also includes a solder resist layer 116 formed on the organic base substrate 110. Each bond pad 112 can be covered by the solder resist layer 116 and exposed from the solder resist layer 116 through an opening formed therein. Each bond pad 112 can have a pre-solder 118 formed within the opening of the solder resist layer 116. Also each conductive pad 114 can be covered by the solder resist layer 116 in part and exposed from the solder resist layer 116 at one edge close to the interconnection layer 130 disposed on the organic base substrate 110. The thickness of the pads 112, 114 can typically range from 1 to 20 micrometers. The thickness of the solder resist layer 116 can be in the range of its adequate film thickness and can typically range from 2 to 50 micrometers. Note that the solder resist layer that is generally organic material is used as an insulation layer disposed on the organic base substrate. However, instead of using the solder resist layer 116, a dielectric layer of insulation material such as inorganic insulation material other than solder mask material can also be contemplated.

The plurality of the bond pads 112 can be divided into a plurality of groups. One group of bond pads (hereinafter, referred to as a first group) 112-1 are positioned at a flip-chip area (referred to as a first flip-chip area) 110b-1 on the interconnection substrate 100. Other group of bond pads (hereinafter, referred to as a second group) 112-2 are positioned at a different flip-chip area (referred to as a second flip-chip area) 110b-2 on the interconnection substrate 100. The second group of the bond pads 112-2 can be located at a distance from the first group of the bond pads 112-1. Note that the pre-solders 118-1, 118-2 formed on the bond pads 112-1, 112-2 are depicted in the top view of FIG. 1B. The first and the second flip-chip areas 110b-1, 110b-2 are areas where one chip (hereinafter, referred to as a first chip) and other chip (hereinafter, referred to a second chip) would be mounted after subsequent chip mounting process, respectively.

The interconnection layer 130 is disposed on the top surface of the organic base substrate 110 and located within a defined area 110a between the first and second groups of the bond pads 112-1, 112-2. The defined area 110a where the interconnection layer 130 is disposed has no solder resist. The interconnection layer 130 can be precisely positioned at the defined area 110a by using an appropriate alignment mark and attached to the organic base substrate 110. Note that the defined area 110a for the interconnection layer 130 overlaps with both of the first and the second flip-chip areas 110b-1, 110b-2 in part. Also the defined area 110a where the interconnection layer 130 is disposed can be recessed to adjust the levels of the top surface of the interconnection layer 130 and the top surface of the solder resist layer 116.

The interconnection layer 130 is bonded to the top surface of the organic base substrate 110 by an adhesive 132. A paste or liquid type or a film type adhesive material can be used for the adhesive 132.

Further referring to FIG. 1A, the structure of the interconnection layer 130 is depicted in more detail. The interconnection layer 130 includes an organic insulation material 134; a conductive pattern 136 embedded in the organic insulation material 134; and a plurality of pads 140-142 exposed at the top surface 130a of the interconnection layer 130, which can be provided by the organic insulation material 134. The pads 140-142 of the interconnection layer 130 are divided into two types. First type is side connection pads 140 used for the side connection and second type is bond pads 141, 142 used for the chip bonding.

Note that the organic insulation material 134 is employed as insulation material for the interconnection layer 130 in the described embodiment. The organic material is preferable for a case where the organic base substrate 110 is employed, in order to alleviate coefficient of thermal expansion (CTE) mismatch between the interconnection layer 130 and the organic base substrate 110, which is typically used as a package substrate. However, the insulation material is not limited to organic material. In other embodiment, inorganic insulation material can also be employed as the insulation material.

In the described embodiment, as representatively described for the first flip-chip area 110b-1, the interconnection layer 130 has an edge E1 located next to the sets of the conductive pads 114-1, and an edge E2 located next to the sets of the conductive pads 114-2, disposed on the organic base substrate 110. The set of the side connection pads 140-1 is located and exposed at the edge E1. Each side connection pad 140-1 is arranged with respect to a corresponding one of the conductive pads 114-1 disposed on the organic base substrate 110. When the set of the conductive pads 114-1 is arranged in a line along one edge close to the interconnection layer 130 with a predetermined interval (e.g., pitch width), the set of the side connection pads 140-1 is also arranged in a line along the edge E1 of the interconnection layer 130 with a predetermined interval (e.g., pitch width) that matches the interval of the conductive pads 114-1. Although there is no particular limitation, in a particular embodiment, the side connection pads 140-1 and the conductive pads 114-1 have a one-to-one relationship.

Each side connection pad 140 has a top surface TS exposed at the top surface 130a of the interconnection layer 130 and an edge surface ES exposed at one edge (e.g., E1) of the interconnection layer 130. The top surface TS is parallel to the top surface of the organic base substrate 110 whereas the edge surface ES is perpendicular to the top surface of the organic base substrate 110 and faces toward the corresponding one of the conductive pads 114. In a preferable embodiment, the edge surface ES and/or the top surface TS of each side connection pad 140 have a barrier metal layer. Examples of the barrier metal layer include a stack of Au/Pd/Ni and a stack of Au/Ni where first element (e.g., Au for both cases) is the top in the stack, an Au layer and a Pd layer. Note that symbols such as Au, Pd, Ni, and the like represent a main element contained in each layer of the stack, which can contain a small or trace amount of other elements to form alloy and/or can also contain a small or trace amount of additives due to the manufacturing process. Also note that each of the bond pads 112 and the conductive pads 114 disposed on the organic base substrate 110 may or may not have a similar barrier metal layer.

As shown in FIG. 1A and FIG. 1B, the interconnection substrate 100 can also include a set of solder joints 119, each of which connects one side connection pad 140 of the interconnection layer 130 with one corresponding conductive pad 114 disposed on the organic base substrate 110. Each solder joint 119 contacts exposed surfaces of the side connection pad 140 (the top surface TS and the edge surface ES) and the conductive pad 114. Note that the solder joints 119-1, 119-2 formed on the conductive pads 114-1, 114-2 and the side connection pads 140-1, 140-2 are also depicted in the top view of FIG. 1B. A symbol 'G' denotes a ground whereas a symbol 'P' denotes a power supply.

In the described embodiment, the pads 112, 114 and the substrate have respective surfaces (pad surfaces PS of the conductive pads 114 and the bond pads 112 and a substrate surface SS around the conductive pads 114 and the bond pads 112) to which a surface treatment for enhancing surface roughness has been applied. In one or more embodiment, the surface treatment includes sandblasting and/or a plasma treatment. Hence, the conductive pad 114 has a pad surface PS that is exposed from the substrate surface SS and is rougher than exposed surfaces of untreated pads. The bond pad 112 also has a pad surface PS exposed from the substrate surface SS and rougher than exposed surfaces of untreated pads. Also the substrate has a part of the substrate surface SS close to the conductive pads 114 and the bond pads 112 that is rougher than other parts of the substrate surface.

Note that the substrate surface SS is defined as a surface of a part that includes the organic base substrate 110 as a substrate body and the solder resist layer 116 formed on the substrate body. The substrate surface SS can include a top surface of the solder resist layer 116, a top surface of the organic base substrate 110 where there is no solder resist, no interconnection layer and no adhesive, and/or a surface of the adhesive 132 at least in part.

The substrate surface SS can be provided by organic material of the solder resist layer 116, the organic base substrate 110 and/or the adhesive 132 and has low wettability for molten solder. The pad surface PS of each of the conductive pads 114 and the bond pads 112 has high wettability for molten solder. In the context of the present invention, the term 'low wettability' means that the surface has a contact angle greater than 90 degrees (90°<θ≤180°) whereas term 'high wettability' means that the surface has a contact angle less than 90 degrees (0<θ<90°). The contact angle (θ) is an angle at which a liquid-air interface meets a solid-liquid interface where the liquid is the molten solder and the solid is the conductive material of the pad 112, 114 or the organic material of the substrate, and provides an inverse measure of wettability.

In a particular embodiment, the part of the substrate surface SS after application of the surface treatment has a roughness parameter (Ra) greater than 0.4 μm and lower than 2 82 m, more preferably greater than 0.5 μm and lower than 1 μm, as long as the thickness of the solder resist layers after the surface treatment is kept sufficiently constant, where Ra represents an average roughness. In terms of another roughness parameter (Rq), the part of the substrate surface SS can have a roughness parameter (Rq) greater than 700 nm and lower than 4 μm, more preferably greater than 0.8 μm and lower than 2 μm, where Rq represents root mean squared roughness. The same can hold for the pad surface PS.

Further note that each of the pads 140, 141, 142 of the interconnection layer 130 also can have a pad surface exposed from the top surface 130a of the interconnection layer 130 and rougher than exposed surface of other untreated pads to which no surface treatment for enhancing surface roughness is applied. Also the top surface 130a of the interconnection layer 130 can have a part close to the pads 140, 141, 142 rougher than other part of the interconnection layers 130 to which no surface treatment for enhancing surface roughness is applied.

In the described embodiment, as representatively described for the first flip-chip area 110b-1, the side connection pads 140-1, the conductive pad 114-1 and accordingly the solder joints 119-1 are located within the flip-chip area 110b-1. The same holds for other flip-chip area 110b-2. However, positions of the side connections (the side connection pads 140, the conductive pads 114 and the solder joints 119) are not limited. In other embodiment, the side connections are placed at positions away from the flip-chip areas 110b since the side connections are not involved directly in the chip bonding.

Here, focusing again to the structure of the interconnection layer 130, the bond pads 141, 142 are exposed from the organic insulation material 134 at the top surface 130a of the interconnection layer 130. The bond pads 141, 142 of the interconnection layer 130 are used for mounting chips disposed thereon in conjunction with the bond pads 112 disposed on the organic base substrate 110. In the described embodiment, the bond pads 141, 142 of the interconnection layer 130 are functionally divided into two types. A first type is a first bond pad 141 used for power supply or ground and a second type is a second bond pad 142 used for signal transmission between the chips.

Each first bond pad 141 used for power supply or ground is connected, via wiring (which is a part of the conductive pattern 136) embedded in the organic insulation material 134, to a corresponding side connection pad 140 that is further connected to the power supply or ground line of the organic base substrate 110 through the solder joint 119.

The bond pads 141, 142 of the interconnection layer 130 are also divided into a plurality of groups in terms of connection partner. One group of bond pads (hereinafter, referred to as a first set) 141-1, 142-1 are positioned at the first flip-chip area 110b-1 and other group of bond pads (hereinafter, referred to as a second set) 141-2, 142-2 are positioned at the second flip-chip area 110b-2. Although not shown in FIG. 1A, one bond pad 142-1 in the first set is electrically connected to a corresponding bond pad 142-2 in the second set by wiring or a trace (which is also a part of the conductive pattern 136) embedded into the organic insulation material 134. Note that conductive pattern 136 can include a plurality of conductive layers with one or more interlayers of the organic insulation material, in which parts of adjacent conductive layers are connected by a conductive via formed through the interlayer. Also the conductive pattern 136 includes a plurality of electrical paths isolated by the organic insulation material.

In FIG. 1A, it is described that the bond pad 141-1 is connected to the side connection pad 140-1 that is located within the same flip chip area 110b-1 and not connected to other side connection pad 140-2 located within the different flip chip area 110b-2. However, since the power supply and the ground can be shared between the plural chips, the power supply or ground line for the first chip can be connected to the same line for the second chip.

In an effort to simplify the description of the embodiment, four bond pads 141, 142, two solder joints 119 (two side connection pads 140 and two conductive pads 114) and two bond pads 112 of the organic base substrate 110 for each chip are shown in FIG. 1B. However, the number of bond pads, the number of solder joint (hence, the number of side connection pads and the number of conductive pads) and the number of the bond pads of the organic base substrate 110 for each chip are not limited and can depend on the specification of the chip. Also the number of flip chip areas is not limited to two.

As described later, the first set of the bond pads 141-1 142-1 of the interconnection layer 130 and the first group of the bond pads 112-1 of the organic base substrate 110 are formed in a 2-dimensional array and configured to receive terminal bumps of the first chip. The same holds for other chips.

In the described embodiment, the interconnection layer 130 shown in FIG. 1 can be attached onto the organic base substrate 110 by using a novel interconnection layer carrying structure. Hereinafter, referring to FIG. 2, an interconnection layer carrying structure 120 used for transferring an interconnection layer onto a target substrate according to an exemplary embodiment of the present invention is described.

FIG. 2 illustrates a schematic of an interconnection layer carrying structure that can be used for transferring an interconnection layer 130 onto the organic base substrate 110 to fabricate the interconnection substrate 100 shown in FIGS. 1A and 1B. The view shown in FIG. 2 is a cross-sectional view of the interconnection layer carrying structure 120.

As shown in FIG. 2, the interconnection layer carrying structure 120 includes a support substrate 122; a release layer 124 formed on the support substrate 122; and an interconnection layer part 131 formed on the release layer 124. The interconnection layer part 131 shown in FIG. 2 corresponds to the interconnection layer 130 shown in FIG. 1 and is illustrated with its top and bottom surfaces being faced upside-down with respect to the view shown in FIG. 1A.

The support substrate 122 is a rigid and stable substrate used to fabricate the interconnection layer part 131 thereon. The support substrate 122 can suitably be any substrate as long as it provides adequate rigidity and stability. In one or more embodiments, the support substrate 122 can be an inorganic substrate including glass, semiconductor such as silicon, ceramic, etc. In a preferable embodiment, the support substrate 122 is a glass substrate since the glass substrate has transparency and thermal expansion coefficient (CTE) (3-12 ppm/degrees Celsius) closer to that of organic material used to build the interconnection layer part 131 in comparison with silicon substrate, for example. Examples of such glass substrate can include soda lime glass, borosilicate glass, fused silica, synthetic quartz glass, to name but a few.

The release layer 124 is a release coating configured to release the interconnection layer part 131 from the support substrate 122 by appropriate treatment. When the support substrate 122 has transparency, UV (ultraviolet)/IR (infrared)/visible light can be irradiated to the release layer 124 from the back side of the support substrate 122 so as to release the interconnection layer part 131 from the support substrate 122.

In one or more embodiments, the release layer 124 can be any known light sensitive release layer that allows de-bonding from the support substrate interface with laser illumination in the field of wafer bonding/de-bonding technology. In a particular embodiment, a light-to-heat conversion release coating, which converts absorbed light energy to heat, can be used as the release layer 124. In these particular embodiments, the release layer 124 can be burned, broken down or decomposed by ablating the release layer 124 using laser illumination after the interconnection layer part 131 is fixed to the organic base substrate 110. In other embodiments, the release layer 124 can be a thermal or UV-releasable adhesive layer whose adhesive property disappears or degrades by heat or UV irradiation. Residual of the release layer 124 can be cleaned after releasing if necessary. In other embodiments, any of the known de-bonding methods including a mechanical peel-off method, a thermal slide-off method and a solvent release method can be employed.

As described by referring to FIGS. 1A and 1B, the interconnection layer part 131 includes the organic insulation material 134; the plurality of the pads 140-142 that face towards the support substrate 122 and are embedded in the organic insulation material 134; the plurality of the traces (or wiring) 136a-136d embedded in the organic insulation material 134.

Although not shown in FIG. 2, in a particular embodiment where film type adhesive material is used for the adhesive 132 in FIG. 1, the interconnection layer part 131 can further include an adhesive layer that is formed on a top of the organic insulation material 134 and can fully cover the top surface of the organic insulation material 134.

The plurality of the pads 140-142 includes the side connection pads 140, the first bond pads 141 for power supply or ground and the second bond pads142 for signal transmission. Each side connection pad 140 is configured to be connected, by a solder joint 119, to a corresponding conductive pad 114 disposed on the organic base substrate 110, to which the interconnection layer part 131 is transferred, as shown in FIG. 1. The plurality of the pads 140-142 are divided into a plurality of groups, including the first set of the pads 140-1, 141-1, 142-1 and the second set of the pads 140-2, 141-2, 142-2. Each pair of the side connection pad 140-1 and the corresponding bond pad 142-1 is electrically coupled by the traces 136a. Each pair of the bond pad 142-1 and the corresponding bond pad 142-2 is electrically coupled by a trace (the trace for connecting the bond pads 142-1, 142-2 is not shown in FIG. 2).

The organic insulation material 134 can be disposed on the release layer 124. In the described embodiment, the top surface of the organic insulation material 134 can be flat and bare surface. In other embodiment, the top surface of the organic insulation material 134 can be covered by an adhesive layer. The pads 140-142 can be exposed at a bottom surface from the organic insulation material 134 and in touch with the release layer 124. In the described embodiment, each pad 140-142 includes a barrier metal layer 138 formed on the release layer 124. Each pad 140-142 can further include a seed metal layer, which can be used to deposit conductive material (e.g., the barrier metal layer 138 and a pad body) at a bottom surface thereof (corresponding to the top surface TS) on the release layer 124 by electrolytic plating. In the preferable embodiment, each side connection pad 140 further includes a barrier metal layer 139 formed at the edge surface ES thereof.

The organic insulation material 134 can be any one of photosensitive insulating resins such as PI (polyimide), BCB (benzocyclobutene), PBO (polybenzoxazole) or other photosensitive polymers. Use of the organic insulation material alleviates CTE mismatch between the interconnection layer 130 and the organic base substrate 110. The conductive pattern 136 can be made of any one of metal materials (e.g., Cu, Al, etc.) and other conductive materials. In a particular embodiment, metal copper can be used for the conductive pattern 136. The barrier metal layer 138, 139 can be, but not limited to, a stack of Au/Pd/Ni or a stack of Au/Ni where first element (e.g., Au for both cases) is the bottom layer in the stack in FIG. 2, an Au layer, or a Pd layer.

In the described embodiment, the edges E1, E2 of the interconnection layer part 131 are aligned with the edges GE1, GE2 of the support substrate 122. As shown in FIG. 2, the interconnection layer part 131 is provided as being fabricated on the support substrate 122 in a form of tape that is formed by organic material and held by the support substrate 122 as a rigid backing material. A process to fabricate the interconnection layer carrying structure 120 will be described later.

Hereinafter, referring to a series of FIGS. 3A-3C and FIGS. 4A-4C, a process for fabricating an interconnection substrate 100 by using an interconnection layer carrying structure 120 according to an exemplary embodiment of the present invention is described. FIGS. 3A-3B and FIGS. 4A-4C illustrate cross-sectional views of structures obtained during the fabrication process of the interconnection substrate 100.

Figure 3A:
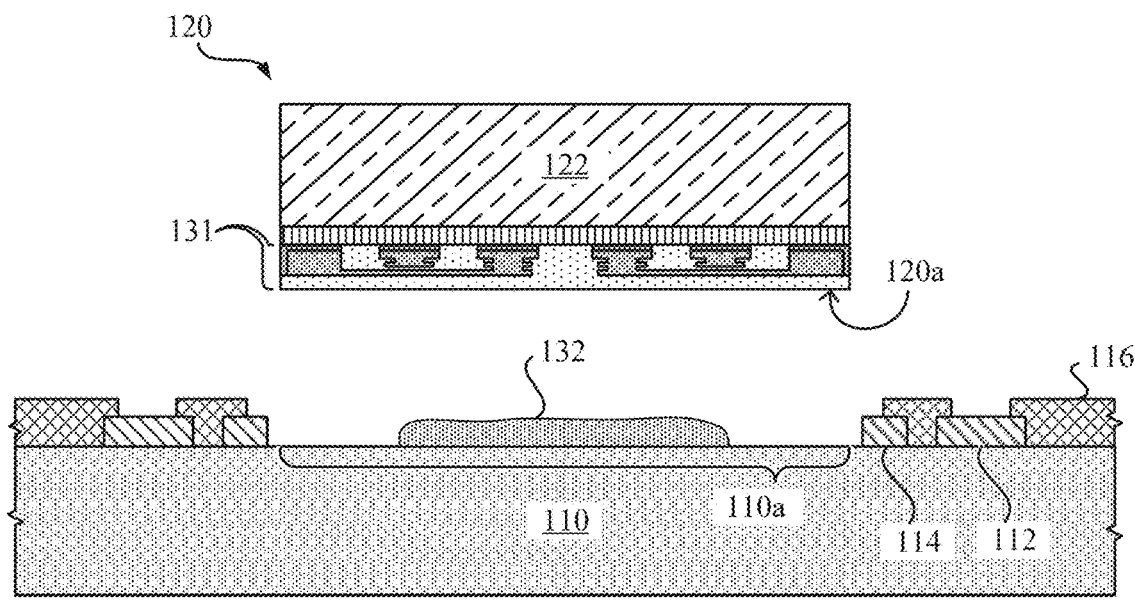
FIG. 3A illustrates a cross-sectional view of structures obtained during a fabrication process of the interconnection substrate using the interconnection layer carrying structure according to an exemplary embodiment of the present invention.

As shown in FIG. 3A, the fabrication process of the interconnection substrate 100 can include a step of providing the organic base substrate 110 and the interconnection layer carrying structure 120. The organic base substrate 110 prepared by this step can include the plurality of the bond pads 112, the set of the conductive pads 114 and the solder resist layer 116 disposed on the organic base substrate 110. Note that there is a defined area 110a on the organic base substrate 110 where no solder resist layer is present.

As shown in FIG. 3A, the fabrication process can further include a step of applying an adhesive 132 onto the organic base substrate 110 within the defined area 110a. In the described embodiment, a paste or liquid type adhesive material, which can have been conventionally used as an underfill when bonding chips with substrates, is used for the adhesive 132. Use of the paste or liquid type adhesive makes it possible to prevent the occurrence of voids in the adhesive 132. However, in a particular embodiment where an adhesive of film type adhesive material is formed on a top of the interconnection layer part 131, the step of applying the adhesive can be omitted.

Figure 3B:
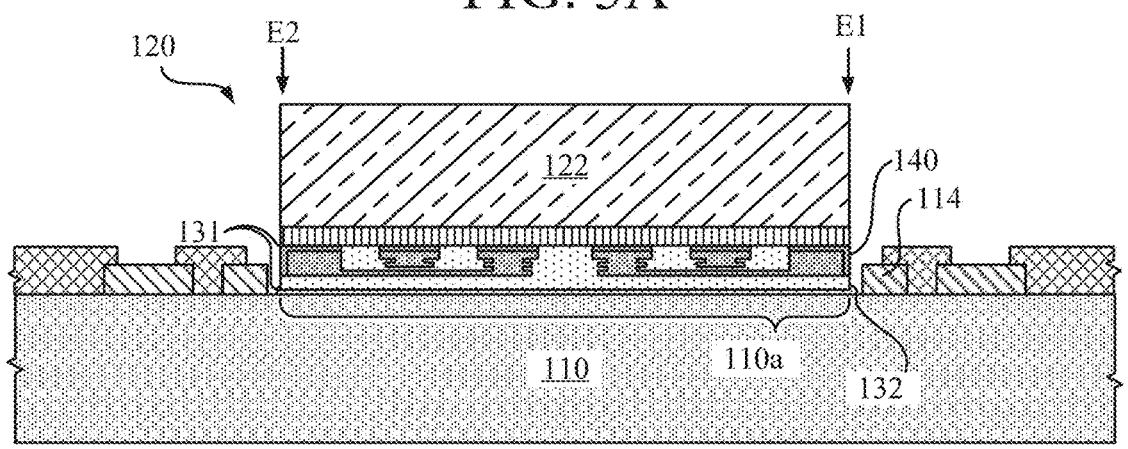
FIG. 3B illustrates a cross-sectional view of structures obtained during a fabrication process of the interconnection substrate using the interconnection layer carrying structure according to an exemplary embodiment of the present invention.

As shown in FIG. 3B, the fabrication process can include a step of placing the interconnection layer carrying structure 120 onto the organic base substrate 110 such that the edges E1, E2 of the interconnection layer part 131 are located next to the respective sets of the conductive pads 114 and each side connection pad 140 is arranged with respect to a corresponding one of the conductive pads 114 disposed on the organic base substrate 110. The interconnection layer carrying structure 120 can be placed onto the organic base substrate 110 by using a bonder in a upside-down manner such that the pads 140-142 face up and the bare surface of the organic insulation material 134 faces down. The bottom of the organic insulation material 134 is attached to the top surface of the organic base substrate 110 within the defined area 110a.

Since the bond pads 141, 142 of the interconnection layer part 131 and the bond pads 112 on the organic base substrate 110 are configured to receive bumps of chips to be mounted, the interconnection layer carrying structure 120 is positioned precisely at the defined area 110a by using an appropriate alignment mark that can be formed on the organic base substrate 110 in advance. The fabrication process can further include a step of curing the adhesive 132 so as to firmly bond the interconnection layer part 131 to the organic base substrate 110 after the step of placing the interconnection layer carrying structure 120 onto the organic base substrate 110.

In other embodiments, the step of the applying the adhesive 132 can be performed after the placement of the interconnection layer carrying structure 120 by way of a capillary or an injection flow method.

Figure 3C:
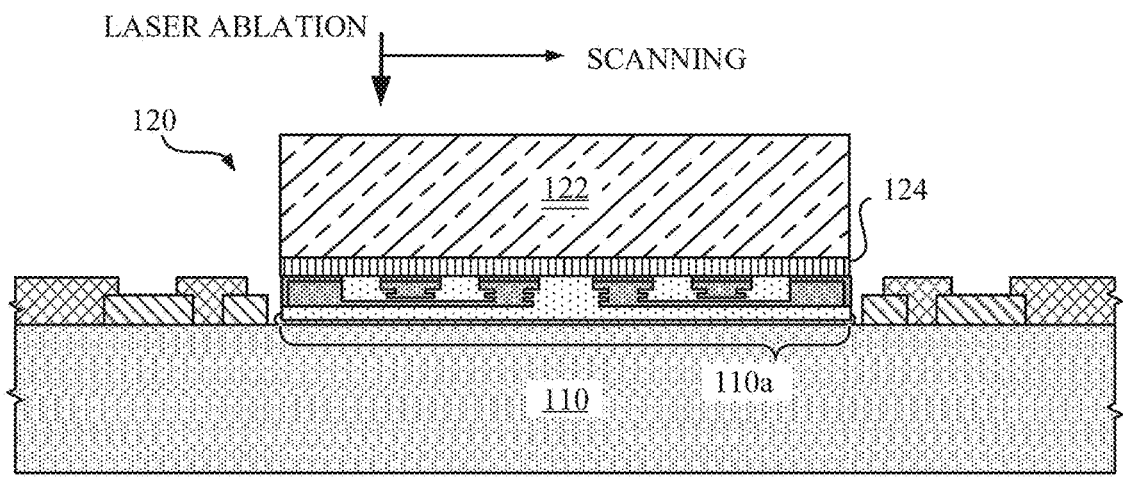
FIG. 3C illustrates a cross-sectional view of structures obtained during a fabrication process of the interconnection substrate using the interconnection layer carrying structure according to an exemplary embodiment of the present invention.

As shown in FIG. 3C, the fabrication process can include a step of releasing the interconnection layer part 131 from the support substrate 122 by removing the release layer 124. In a particular embodiment, the support substrate 122 has transparency and the step of releasing from the support substrate 122 can be done by ablating the release layer 124 with laser illumination through the support substrate 122 while scanning the laser beam.

By performing aforementioned steps, the interconnection layer part 131 is transferred from the interconnection layer carrying structure 120 to the organic base substrate 110 at the defined area 110a to obtain an interconnection layer 130 attached on the organic base substrate 110. The releasing step shown in FIG. 3C leaves the interconnection layer 130 on the organic base substrate 110 such that the set of the pads 140-142 faces in a direction opposite to the organic base substrate 110.

Figure 4A:
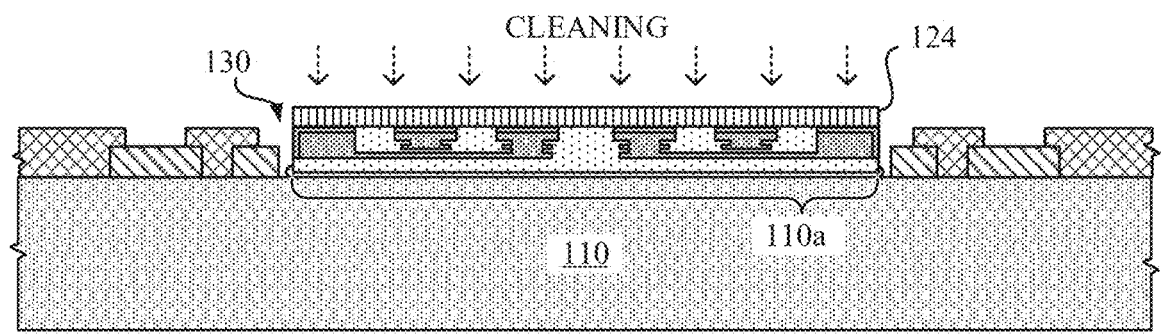
FIG. 4A illustrates a cross-sectional view of structures obtained during the fabrication process of the interconnection substrate using the interconnection layer carrying structure according to the exemplary embodiment of the present invention.

As shown in FIG. 4A, the fabrication process can also include a step of performing cleaning of residuals on a top of the interconnection layer 130, which can include residuals of the release layer 124, after the step of removing the release layer 124. The cleaning of the residuals can be performed by virtually any means, including $O_2$ plasma irradiation. In a particular embodiment, the fabrication process can also include a step of performing an etching of surfaces of the pads 140-142, which can include a seed metal layer formed on the pads 140-142, to expose bare surface of the metal stack 138, after the step of removing the release layer 124.

Figure 4B:
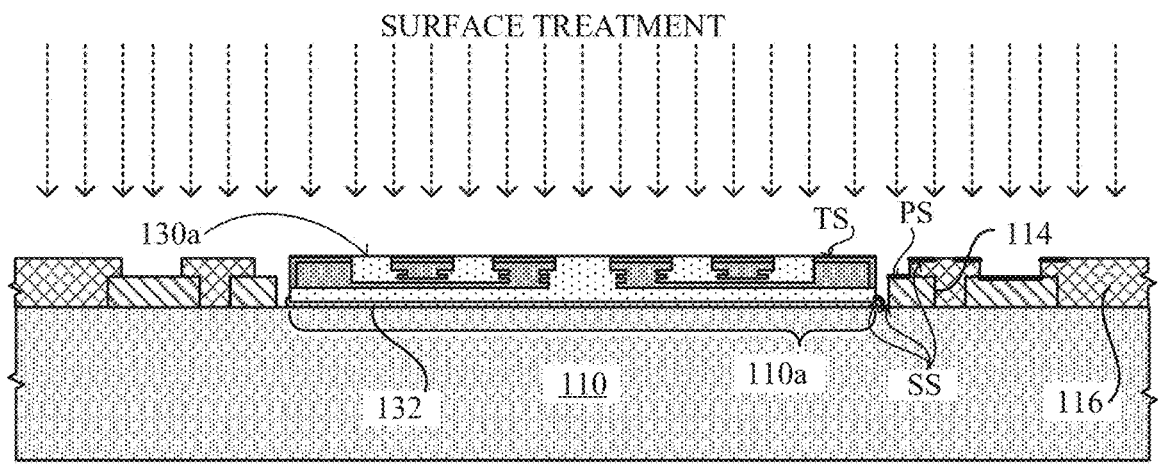
FIG. 4B illustrates a cross-sectional view of structures obtained during the fabrication process of the interconnection substrate using the interconnection layer carrying structure according to the exemplary embodiment of the present invention.

As shown in FIG. 4B, the fabrication process can include a step of applying a surface treatment for enhancing surface roughness to exposed pad surfaces PS of the conductive pads 114 and the bond pad 112 and a part of the exposed substrate surface SS around the conductive pads 114 and the bond pad 112. Examples of such surface treatment for enhancing surface roughness include sandblasting (abrasive blasting) and plasma treatment.

In a preferable embodiment, sandblasting is employed as the surface treatment. The sandblasting can be conducted by using an appropriate abrasive media of a particle size under an appropriate condition such as collision speed of the abrasive media. There are many types, such as, for example, dry blasting and wet blasting. The wet blasting, in which the abrasive media and the liquid such as water are shoot to a work piece, is preferable since the wet blasting has an ability to use finer abrasive media than the dry blasting. Sandblasting is preferable since sandblasting modifies the exposed surfaces mechanically and physically without affecting chemical surface conditions significantly. Also it is possible to control roughness of the exposed surfaces more precisely, with a wider control range, by using appropriate abrasive particles.

In a particular embodiment, the plasma treatment is employed as the surface treatment. The plasma treatment can use Argon (Ar) plasma, Oxygen ($O_2$) plasma and mixture thereof. The plasma treatment using Ar plasma can be preferably employed since Ar plasma has ability to prevent oxidation. However, $O_2$ plasma treatment is also contemplated in a case where the pads 112, 114 are protected by precious metal layers such as an Au layer formed on the top, for example. The plasma treatment can be conducted under an appropriate condition, which can include RF (radio frequency) power, accelerating voltage, flow rate of gas, application time, etc. such that sufficient enhancement of surface roughness is obtained.

Although plasma treatments are often applied to a target surface to remove organic residual to clean the surface and/or to functionalize the surface for modifying surface characteristic chemically, the plasma treatment according to the exemplary embodiment is different from such plasma treatment for cleaning and/or surface functionalization in terms of the aim and the conditions. Generally, in order to make the target surface sufficiently rougher, the plasma treatment is applied for a relatively extended duration. Also, the plasma treatment for enhancing the surface roughness would physically roughen the surface, and the roughening effect persists for relatively long time. In contrast, the effectiveness of the plasma treatment in terms of cleaning and/or surface functionalization is short since the cleaned surface tends to be contaminated over time and the surface condition changes over time, hence the cleaning/functionalization effect decays with time. Also, since the plasma treatment, especially $O_2$ plasma treatment, can make the resin surface more hydrophilic due to interaction between active species and the surface molecules, it is preferable to leave the exposed surface of the solder resist layer 116 after the plasma treatment for a while until the hydrophilicity decays sufficiently.

Enhancement of the surface roughness improves solder wettability of a surface having high wettability while improving de-wettability of a surface having low wettability. The wettability of molten solder depends on the surface roughness of the solid components when the material of three phases is identical. The wettability is represented by contact angle in Wenzel's equation as follows:

$$\cos \theta_w = r \cos \theta,$$

where $\theta_w$ denote an apparent contact angle, $\theta$ denotes a Young's contact angle and r represents a roughness ratio (r=1 for smooth surface and r>1 for rough surface).

When the surface irregularities are so fine that air remains at the interface and forms chemically heterogeneous surface, Cassie equation holds as follows:

$$\cos \theta'_c = f \cos \theta_a + (1-f) \cos \theta_b,$$

where f denotes a ratio of area contacting the liquid and solid phases, $\theta_a$ denote an contact angle for component A with a fractional surface area f and $\theta_b$ denote an contact angle for components B with a remaining fractional surface area (1−f). When the liquid contacts the air (e.g., $\theta_b$=180 degrees), The Cassie equation is as follows:

$$\cos \theta'_c = f \cos \theta_a + 1 - f.$$

Hence, the contact angle $\theta'_c$ increases even if the interface between the solid and liquid includes the air. When f=1 and the surface returns to homogeneity, the Wenzel's equation would hold.

The application of the surface treatment modifies both of different wetting characteristics of the exposed surfaces in respective strengthening directions. The substrate surface SS with the low wettability (90 degree<$\theta$<180 degrees) becomes more non-wettable ($\theta_w$>$\theta$). Simultaneously, the pad surface PS with the high wettability (0<$\theta$<90 degrees) becomes more wettable ($\theta_w$<$\theta$). The enhancement of the surface roughness improves solder wettability of the exposed pad surface PS of the pads 114 having high wettability while improving de-wettability of the substrate surface SS having low wettability. Thereby, it is possible to prevent adjacent side connections from bridging when soldering, and improve reliability of the side connections as well as chip bonds even if the pitch widths between the side connections and bonds are fine.

The surface treatment for enhancing the surface roughness is performed after the step of releasing the interconnection layer part 131 from the support substrate 122. In this embodiment, the surface of the pads 140, 141, 142 (including the top surface TS (and possibly the edge surface ES) of the side connection pad 140) and at least a part of the top surface 130a of the interconnection layer 130 close to the pads 140, 141, 142 can also be subjected to the surface treatment.

Figure 4C:
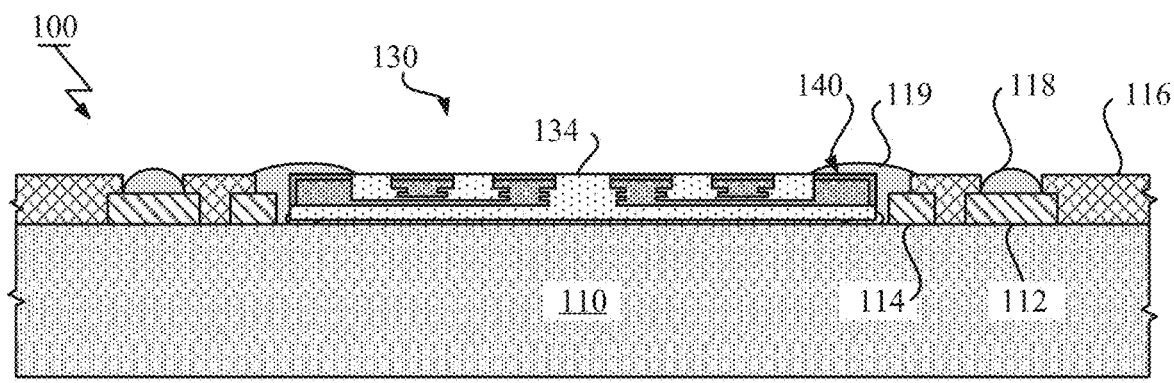
FIG. 4C illustrates a cross-sectional view of structures obtained during the fabrication process of the interconnection substrate using the interconnection layer carrying structure according to the exemplary embodiment of the present invention.

As shown in FIG. 4C, the fabrication process can include a step of forming a set of solder joints 119 to connect the side connection pads 140 of the interconnection layer 130 with the corresponding conductive pads 114 disposed on the organic base substrate 110, respectively. A set of pre-solders 118 can also be formed by this step. Each solder joint 119 can be formed by applying solder paste onto the side connection pads 140 and the corresponding conductive pads 114 and by heating to melt the solder paste to form mechanical and electrical joints. The paste can be applied by jet printing, stencil printing or syringe. In alternative embodiment, injection molten soldering (IMS) can be employed to form the solder joints 119. The IMS technology is advantageous when a larger volume of solder is preferable.

In the described embodiment, the step of heating the solder paste 117 to form the set of the solder joints 119 is conducted before the chip mounting. It is suitable for a case where there is a delay until the subsequent chip mounting process is performed. Also in a case where the subsequent chip mounting process does not use a reflow process, the formation of the solder joints 119 is preferably conducted before the chip mounting. However, in a case where the subsequent chip mounting process uses a reflow process, the step of heating the solder paste 117 at this stage can be omitted and the completion of the solder joints 119 can delayed until reflow process of the subsequent chip mounting process.

The interconnection substrate 100 obtained by the fabrication process shown in the series of FIGS. 3A-3C and FIGS. 4A-4C (including the organic base substrate 110, the interconnection layer 130 and the set of the solder joints 119 formed on the side connection pads 140 of the interconnection layer 130 and the corresponding conductive pads 114 of the organic base substrate 110) can be passed to a subsequent process such as chip mounting process.

Figure 5:
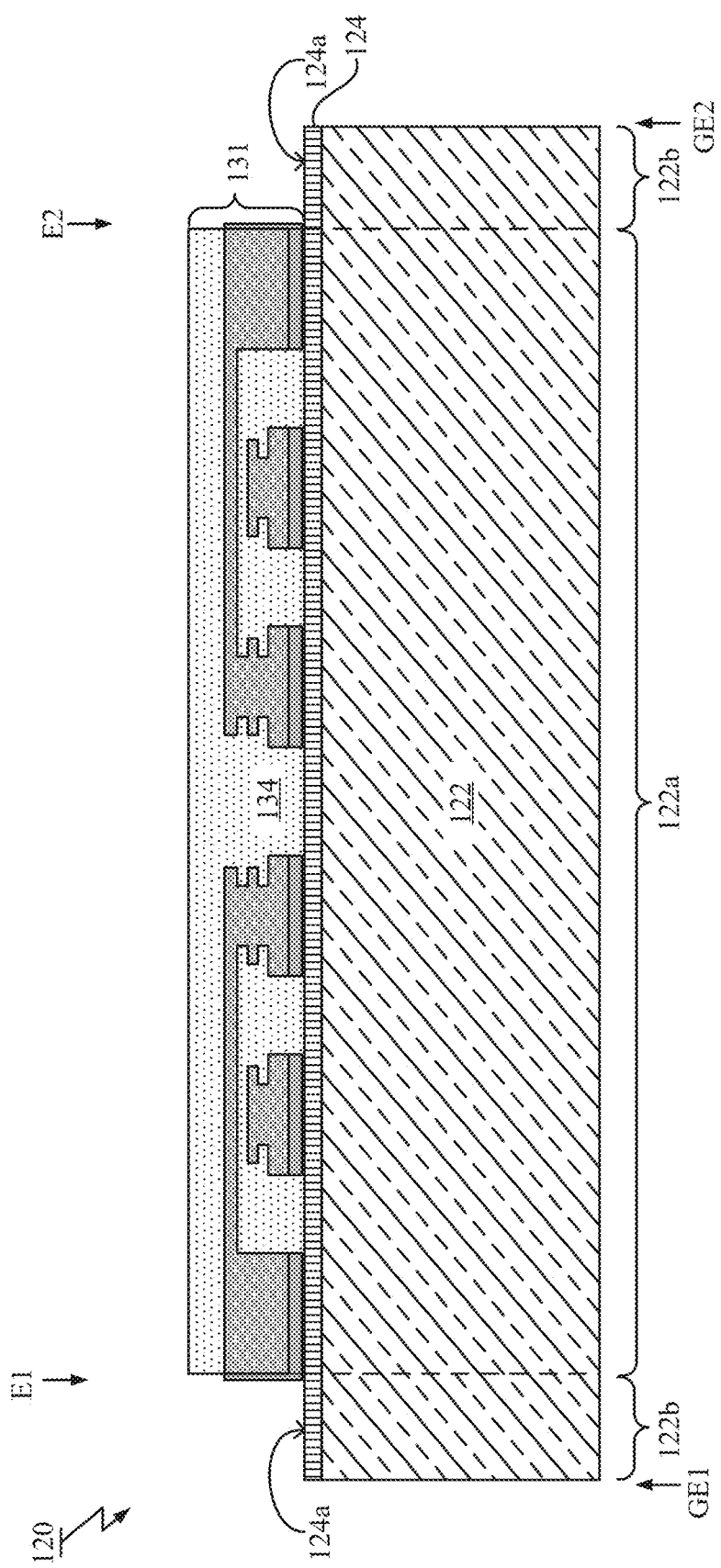
FIG. 5 illustrates a schematic of an interconnection layer carrying structure used for transferring an interconnection layer onto a target substrate according to other embodiment of the present invention.

FIG. 5 illustrates a schematic of an interconnection layer carrying structure used for transferring an interconnection layer onto a target substrate according to other embodiment of the present invention. In the embodiment described by referring to FIG. 2, the edges E1, E2 of the interconnection layer part 131 are aligned with the edges GE1, GE2 of the support substrate 122. In contrast, in the particular embodiment shown in FIG. 5, the interconnection layer part 131 is formed within a predefined area on the support substrate 122 such that the support substrate 122 has a base part 122a on which the interconnection layer part 131 is fabricated and extended parts (or eaves) 122b of both edges extending outside the base part 122a. The extended parts 122b are parts of the support substrate 122 that overhang edges E1, E2 of the interconnection layer part 131 when turned upside down. In the embodiment shown in FIG. 5, the edges E1, E2 of the interconnection layer part 131 are not aligned with the edges GE1, GE2 of the support substrate 122. The extended parts 122b of the support substrate 122 have planar surfaces configured to be approximately parallel to a planar surface of the organic base substrate 110 by way of abutment of the extended part 122b when transferring the interconnection layer 130 onto the organic base substrate 110 from the support substrate 122.

In a particular embodiment, the organic base substrate 110 has the solder resist layer 116 that has the planar surface for the abutment. The planar surfaces of the extended parts 122b of the support substrate 122 are configured to abut against the planar surface of the solder resist layer 116 of the organic base substrate 110 directly or indirectly when transferring the interconnection layer 130.

In the particular embodiment, the planar surfaces of the extended parts 122b are provided as the top surface 124a of the release layer 124. However, it is not necessary that the release layer 124 extends to the areas of the extended parts 122b of the support substrate 122. In other embodiment, the extended parts 122b of the support substrate 122 provide directly planar surfaces that are configured to be approximately parallel to the planar surface of the solder resist layer 116 when the support substrate 122 is brought into contact with the solder resist layer 116.

Also in the particular embodiment, the solder resist layer 116 has the planar surface for the abutment. However, in other embodiment, the level of the top surface of the interconnection layer 130 and the level of the top planar surface of the solder resist layer 116 can be adjusted by using an appropriate spacer that is inserted between the extended parts 122a of the support substrate 122 and the solder resist layer 116 so as to have a suitable level difference.

In the particular embodiment using the interconnection layer carrying structure 120 shown in FIG. 5, the step of placing the interconnection layer carrying structure 120 onto the organic base substrate 110 shown in FIG. 3B includes a sub-step of leveling the planar surfaces of the extended parts 122b by way of abutment such that the planar surfaces of the extended parts 122b become approximately parallel to the top planar surface of the solder resist layer 116 of the organic base substrate 110.

Hereinafter, referring to FIGS. 6A-6D a process for fabricating an organic base substrate 110 according to a particular embodiment of the present invention is described. FIGS. 6A-6D illustrate cross-sectional views of structures obtained during the fabrication process of the organic base substrate 110.

Figure 6A:
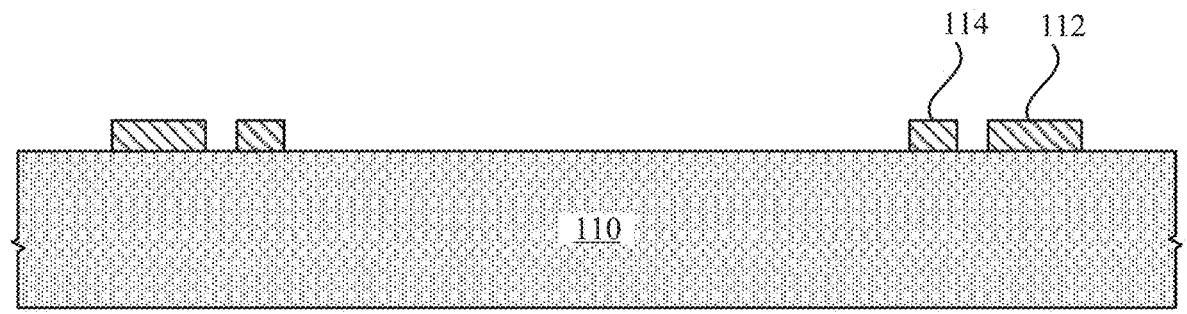
FIG. 6A illustrates a cross-sectional view of structures obtained during a fabrication process of an organic base substrate according to a particular embodiment of the present invention.

As shown in FIG. 6A, the fabrication process can include a step of preparing the organic base substrate 110 that includes the plurality of the bond pads 112 and the set of the conductive pads 114. The bond pads 112 and the conductive pads 114 can be made of metal copper and formed by any build-up process, including semi-additive, additive process, subtractive process, etc. Although the process shown in FIGS. 6A-6D shows only fabrication process of the conductive pad 112, 114, the organic base substrate is composed of a core of composite material such as a glass-epoxy, general wiring layers, and insulation layers.

Figure 6B:
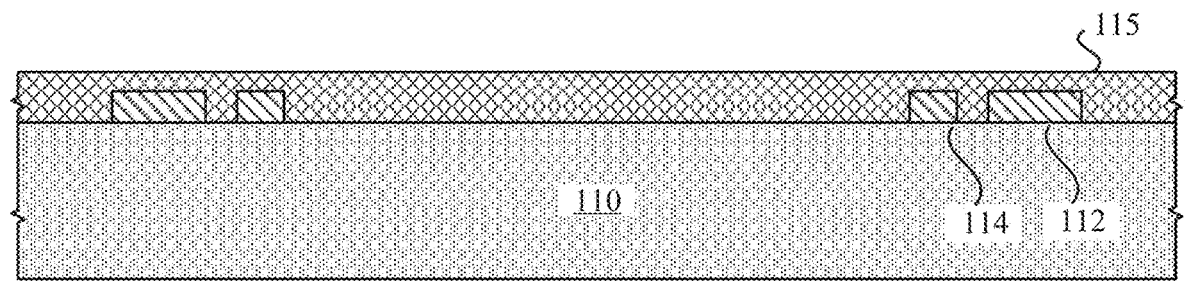
FIG. 6B illustrates a cross-sectional view of structures obtained during a fabrication process of an organic base substrate according to a particular embodiment of the present invention.

As shown in FIG. 6B, the fabrication process can include a step of applying photosensitive solder resist 115 on the organic base substrate 110 including areas of the bond pads 112 and the conductive pads 114. Such photosensitive resist is coated by any process, including, for example, spray coating, dip coating, curtain-coating, lamination, etc.

Figure 6C:
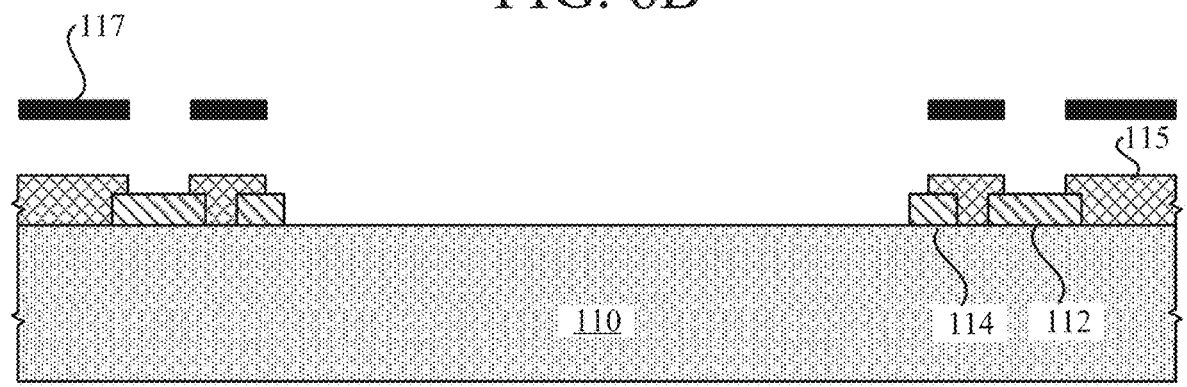
FIG. 6C illustrates a cross-sectional view of structures obtained during a fabrication process of an organic base substrate according to a particular embodiment of the present invention.
Figure 6D:
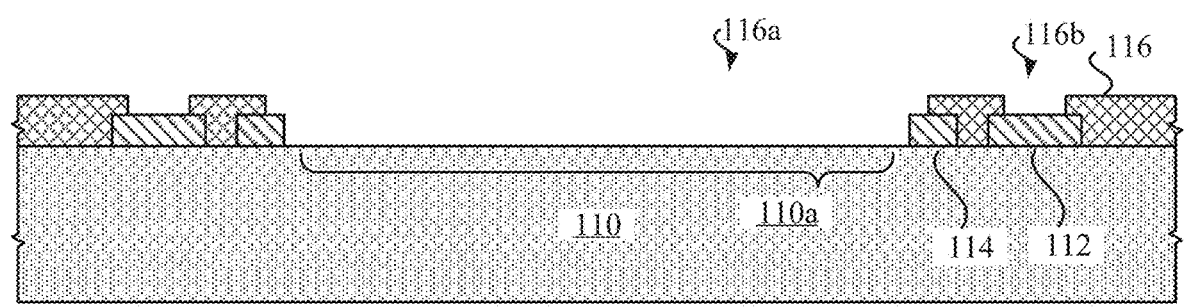
FIG. 6D illustrates a cross-sectional view of structures obtained during a fabrication process of an organic base substrate according to a particular embodiment of the present invention.

As shown in FIG. 6C, the fabrication process can include a step of exposing and developing the photosensitive solder resist 115 using a mask 117 to obtain the structure shown in FIG. 6D, which has a patterned solder resist 116. The patterned solder resist 116 shown in FIG. 6D has openings 116b on the bond pads 112 and a cavity 116a exposing the surface of the defined area 110a and the edges of the conductive pads 114 close to the defined area 110a. In the embodiment shown in FIG. 6C, the mask 117 is a dark filed mask and the solder resist is positive type. However, in other embodiment, a light field mask and a negative type photo sensitive resist material can also be employed.

Hereinafter, referring to FIGS. 7A-7D, an alternative process for fabricating an organic base substrate 110 according to other particular embodiment of the present invention is described. FIGS. 7A-7D illustrate cross-sectional views of structures obtained during the alternative fabrication process of the organic base substrate.

Figure 7A:
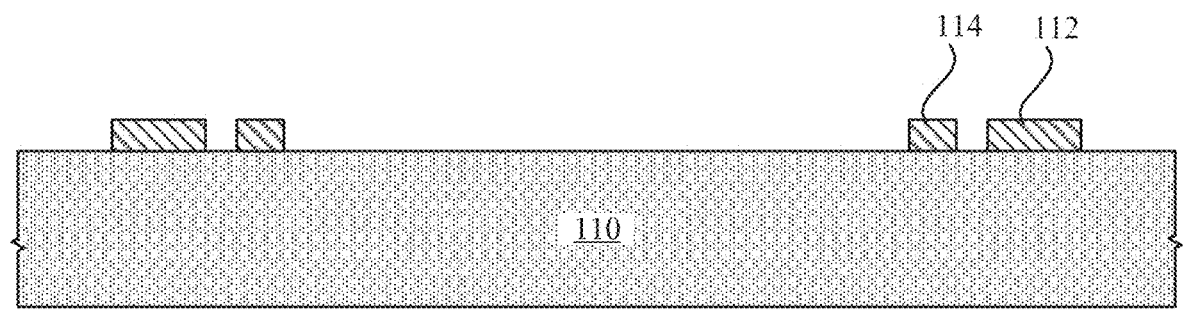
FIG. 7A illustrates cross-sectional view of structures obtained during a fabrication process of an organic base substrate according to other particular embodiment of the present invention.
Figure 7B:
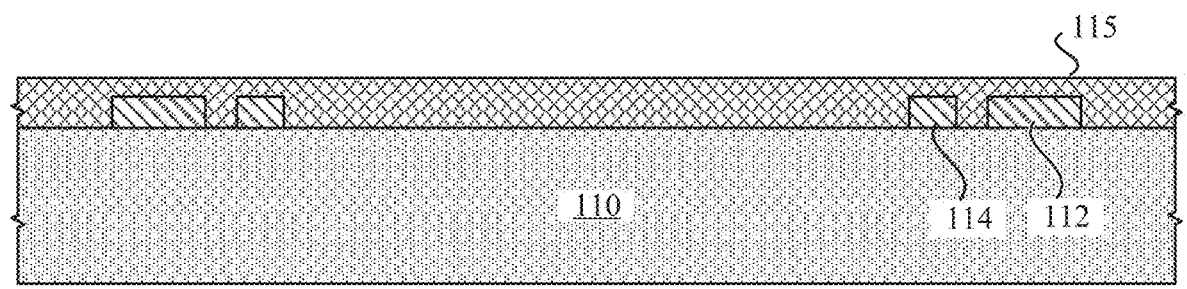
FIG. 7B illustrates a cross-sectional view of structures obtained during a fabrication process of an organic base substrate according to other particular embodiment of the present invention.
Figure 7C:
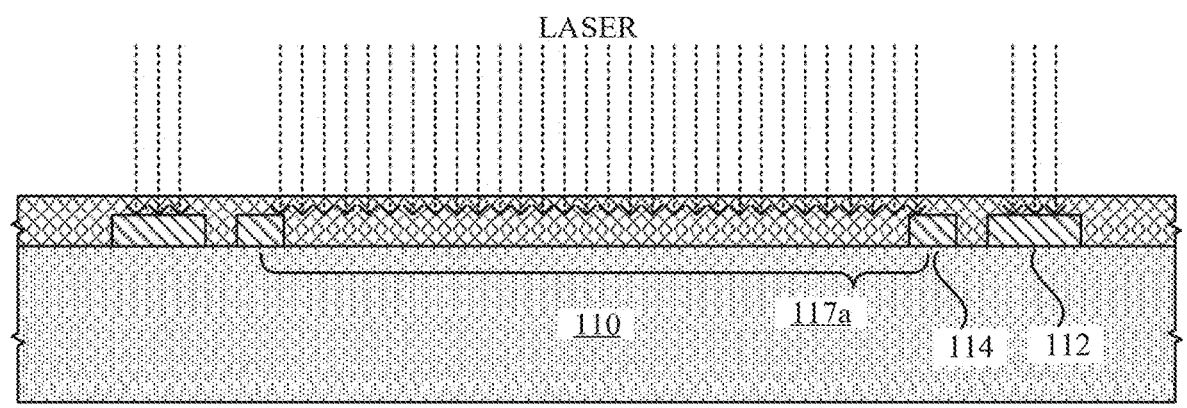
FIG. 7C illustrates a cross-sectional view of structures obtained during a fabrication process of an organic base substrate according to other particular embodiment of the present invention.
Figure 7D:
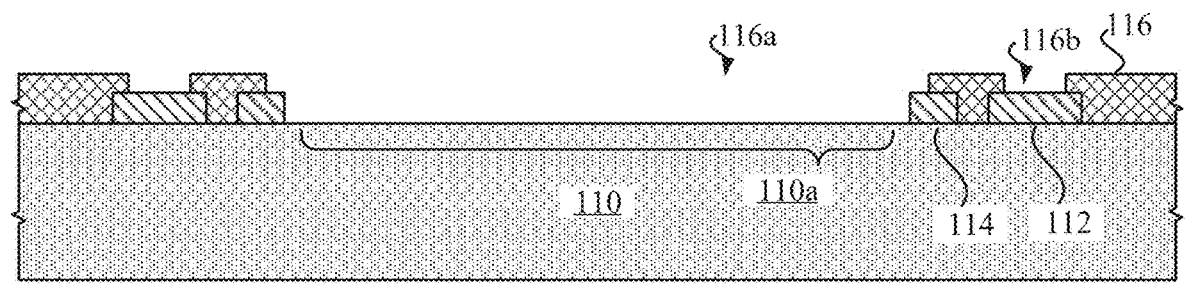
FIG. 7D illustrates a cross-sectional view of structures obtained during a fabrication process of an organic base substrate according to other particular embodiment of the present invention.

As shown in FIG. 7A, the fabrication process of the organic base substrate can include a step of providing the organic base substrate 110 that includes the plurality of the bond pads 112 and the set of the conductive pads 114. As shown in FIG. 7B, the fabrication process can include a step of applying solder resist 115 on the organic base substrate 110. As shown in FIG. 7C, the fabrication process can include a step of processing the solder resist 115 by laser irradiation to obtain the structure shown in FIG. 7D, which has a patterned solder resist 116. The patterned solder resist 116 has openings 116b on the bond pads 112 and a cavity 116a exposing the defined area 110a and the edges of the conductive pads 114 close to the defined area 110a.

Hereinafter, referring to FIG. 8, a schematic of an interconnection structure after chip mounting according to the exemplary embodiment of the present invention is described.

Figure 8:
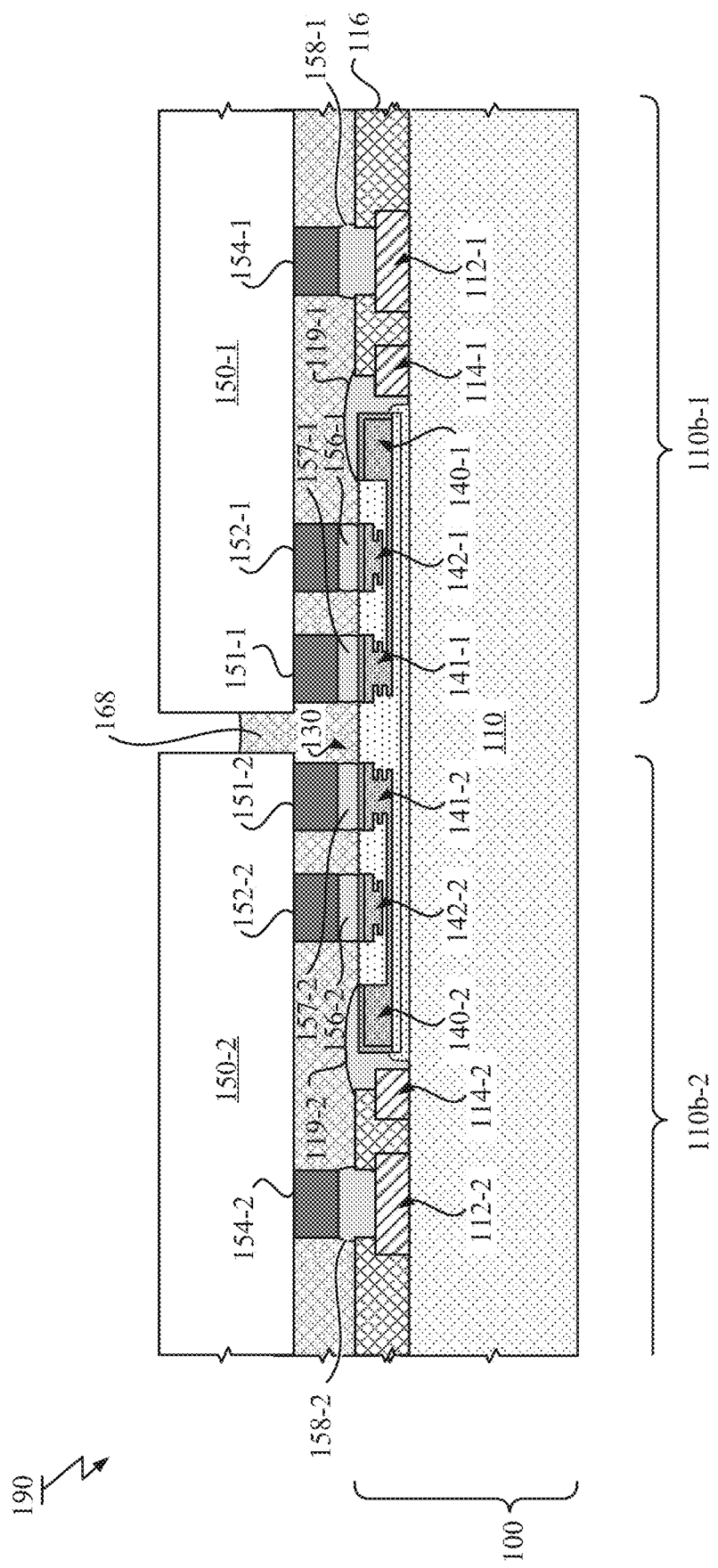
FIG. 8 illustrates a cross-sectional view of an electronic device around the interconnection layer according to an exemplary embodiment of the present invention.

FIG. 8 illustrates a schematic of an electronic device 190 that includes an interconnection substrate 100 as an interposer and is an interconnection structure after the chip mounting. FIG. 8 shows an enlarged cross-sectional view of the electronic device 190 around the interconnection layer 130. As shown in FIG. 8, there are two chips 150-1 and 150-2 mounted on the interconnection substrate 100. Examples of the chip can include a CPU (Central Processing Unit), a GPU (Graphical Processing Unit), a SoC (System on a Chip), a memory device such as a HBM (High Bandwidth Memory), etc. The first chip 150-1 and the adjacent second chip 150-2 can be configured to perform signal transmission each other through the interconnection layer 130 that is located between the first and second chips 150-1, 150-2. In the described embodiment, the chips 150 are connected to a power supply or ground line of the organic base substrate 110, which works as a signal return current path, through the writing in the interconnection layer 130.

As shown in FIG. 8, the electronic device 190 includes the aforementioned interconnection substrate 100; and the first and second chips 150-1, 150-2 mounted on the interconnection substrate 100 with its active surface being faced down. Each chip 150 can be located at a position corresponding to the flip-chip area 110b on the interconnection substrate 100. The gap between the interconnection substrate 100 and the chip 150 can be filled by an underfill 168, which can be made of epoxies or urethanes.

The first group of the bond pads 112-1 and the first set of the bond pads 141-1, 142-1 are positioned within the first flip-chip area 110b-1 where the first chip 150-1 is mounted. The first chip 150-1 has a set of terminal bumps 151-1, 152-1 electrically connected to the first set of the pads 141-1, 142-1 of the interconnection layer 130 through a solder 156-1, 157-1. The first chip 150-1 has also a set of other terminals 154-1 electrically connected to the first group of the bond pads 112-1 on the organic base substrate 110 through a solder 158-1. The terminal bumps 151-1, 152-1, 154-1 can be but not limited to, Cu pillar type bumps. The terminal bumps 151-1 can be a power supply or ground terminal that is configured to connect with the power supply or ground line that can work as a signal return current path. More specifically, the terminal bumps 151 is connected to the bond pad 141 that is connected, via wiring embedded in the organic insulation material 134, to the corresponding side connection pad 140 that is further connected to the power supply line or the ground line of the organic base substrate 110 through the solder joint 119. The same applies to the second flip-chip area 110b-2 and the second chip 150-2.

Although not shown in FIG. 8, the interconnection substrate 100 on which the a plurality of the chips 150 are mounted constitutes an electronic package, which can have bumps formed at the bottom of the interconnection substrate 100 and is further mounted on a mother board through package interconnections between the bumps of the interconnection substrate 100 and pads formed on the mother board. The final assembly product including the interconnection substrate 100, the chips 150 and the mother board can also be one of the electronic devices and is also an interconnection structure after the chip mounting.

The plurality of chips 150 can communicate with each other through the interconnection layer 130 while the chips 150 are connected to the mother board through the internal structure of the organic base substrate 110. Further according to the described embodiment, the power supply lines and the ground lines to the chips 150 can be routed through the interconnection layer 130 by way of the side connections achieved by the solder joint 119. It permits suppression of voltage drops in comparison with a case where routing of the wiring on the organic base substrate is conducted while avoiding an area of the interconnection layer. Provision of a power supply or ground line that works as a signal return current path by using the interconnection layer is advantageous for high-speed signal transmission.

The interconnection structure allows us to introduce a novel side connection between the conductive pad 114 of the organic base substrate 110 and the side connection pad 140 of the interconnection layer 130. Introduction of the novel side connection improves flexibility for routing of wiring with the interconnection layer 130. Also, it relaxes constraints on a terminal layout of the chip 150 that uses the interconnection layer 130. Such interconnection structure is suitable for heterogeneous integration.

Although FIG. 8 shows merely two chips and one interconnection layer 130 through which the two chips communicate. However, the number of chips, the number of chips per one interconnection layer and the number of the interconnection layers in the electronic device is not limited.

Figure 9A:
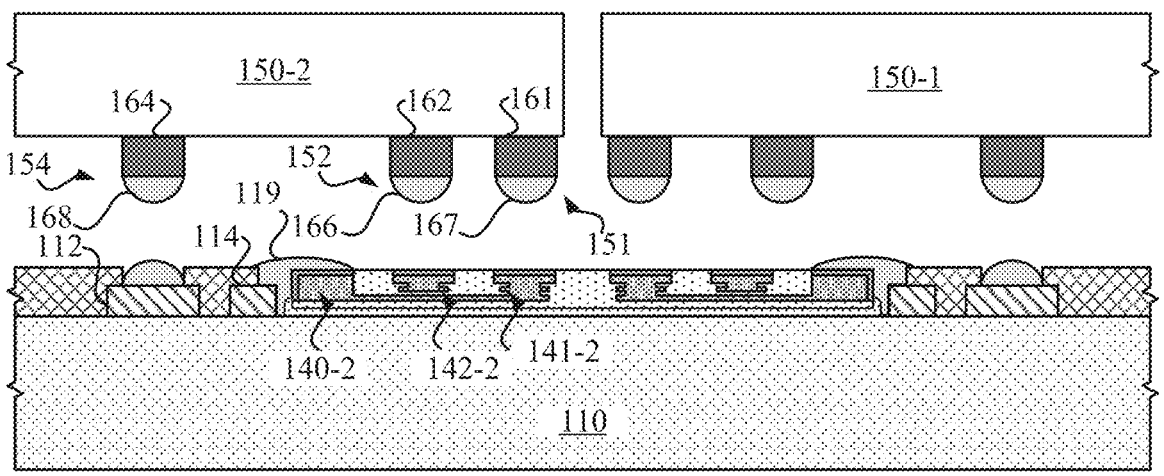
FIG. 9A illustrates a cross-sectional view of structures obtained during a fabrication process of an electronic device according to the exemplary embodiment of the present invention.
Figure 9B:
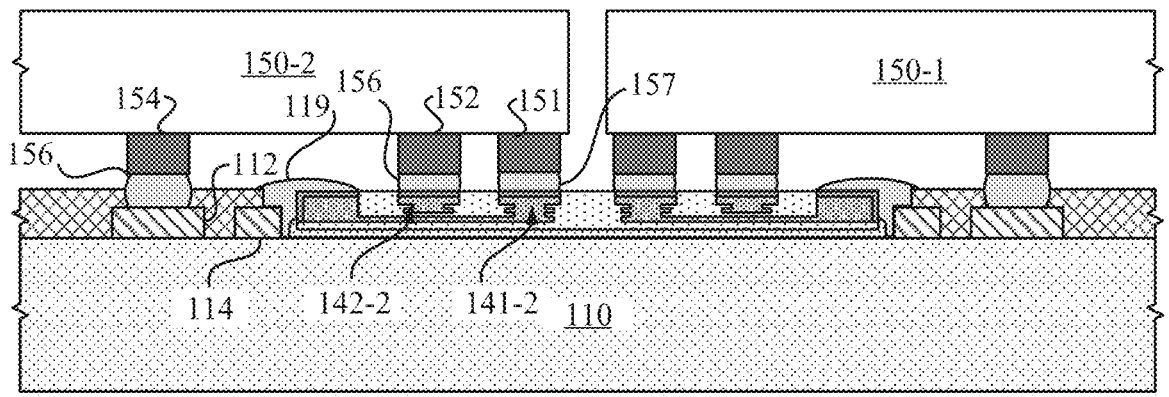
FIG. 9B illustrates a cross-sectional view of structures obtained during a fabrication process of an electronic device according to the exemplary embodiment of the present invention.
Figure 9C:
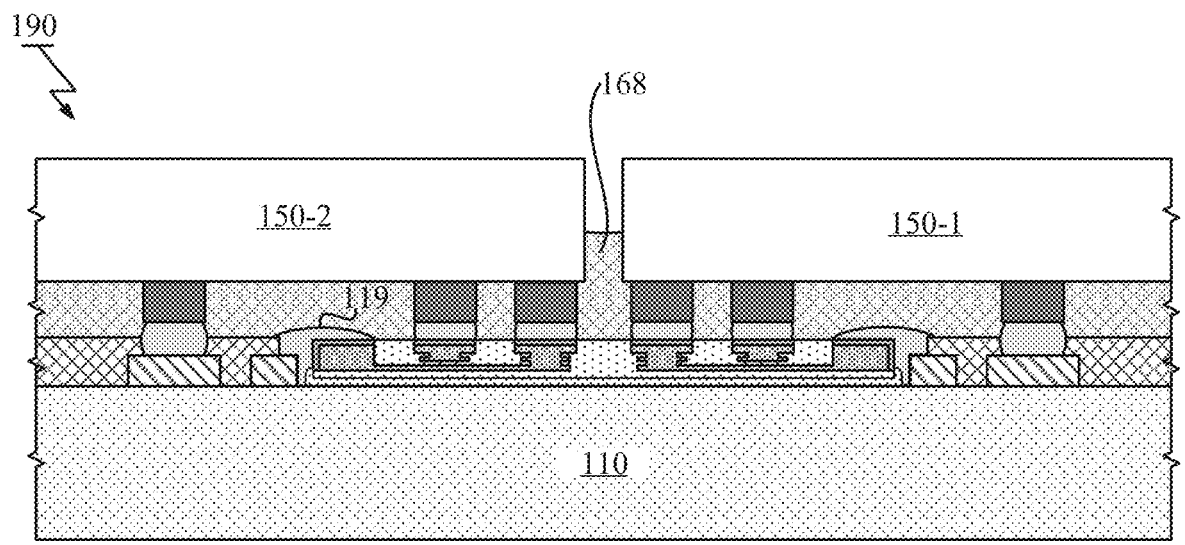
FIG. 9C illustrates a cross-sectional view of structures obtained during a fabrication process of an electronic device according to the exemplary embodiment of the present invention.

Referring to FIGS. 9A-9C, a fabrication process of the electronic device that is subsequently performed after the fabrication process of the interconnection substrate according to the exemplary embodiment of the present invention. FIGS. 9A-9C illustrate cross-sectional views of structures obtained during the fabrication process of the electronic device 190.

As shown in FIG. 9A, the fabrication process of the electronic device can include a step of mounting a plurality of chips 150 onto the interconnection substrate 100 with it active surface being faced down. The first chip 150-1 can be located at a position where the first group of the bond pads 112-1 and the first set of the pads 141-1, 141-2 of the interconnection layer 130 locate. The same applies to the second chip 150-2.

The chips 150 prepared for this step can include terminal bumps 151, 152, 154, each of which can be made up of a pillar 161, 162, or 164 and a solder cap 166, 167, or 168 formed thereon. In the described embodiment, the terminal bumps 151, 152, 154 are Cu pillar bumps. However, in other embodiment, the terminal bumps 151, 152, 154 can be any of, for example, flip-chip bump, fine-pitch, micro-bump, Cu pillar bump, Cu post bump with Sn a cap (SLID), etc. In the described embodiment, there is no solder on the bond pads 141, 142 of the interconnection substrate 100 prepared for this step since each bond pad 141, 142 has the barrier metal layer 138 on top, which improves wettability. However, applying solder onto the bond pads 141, 142 before chip mounting is not hindered.

As shown in FIG. 9B, the fabrication process can include a step of forming solder interconnection 156, 157, 158 between the bond pads 112 and the bond pads 141,142 and the pillars 161, 162, 164 by solder reflow process.

By performing the steps shown in FIGS. 9A and 9B, the chips 150 are mounted on the interconnection substrate 100 such that the chips 150 has terminal bumps 151 that are bonded to the bond pads 141 and are electrically connected to the conductive pads 114 disposed on the organic base substrate 110 through the side connection pads 140 by the solder joints 119.

As shown in FIG. 9C, the fabrication process can include a step of dispensing a underfill 168 to fill a gap between the interconnection substrate 100 and the chips 150 by capillary flow underfill process, followed by curing so as to fix the first chip 150-1 and the second chip 150-2 to the interconnection substrate 100.

In the described embodiment, the underfill 168 is described as being applied onto the organic base substrate 110 after it has been subjected to the reflow treatment. However, in other embodiment, no-flow underfill can be dispensed on the interconnection substrate 100 at first. Then, the chips 150 are placed on the interconnection substrate 100 where the underfill has been dispensed. Finally, forming of the solder interconnections 156, 157, 158 and curing of the underfill are performed by a reflow treatment, simultaneously. In the described embodiment, solder reflow process is used as bonding process. However, in other embodiment, thermal compression (TC) bonding process can also be contemplated instead of the solder reflow process.

Hereinafter, referring to a series of FIGS. 10A-10F, FIGS. 11A-11E, FIGS. 12A-12D, FIGS. 13A-13E, FIGS. 14A-14D and FIGS. 15A-15D, a process for fabricating an interconnection layer carrying structure, which can be used to transfer an interconnection layer onto an organic base substrate, according to an exemplary embodiment of the present invention is described. FIGS. 10A-10F, FIGS. 11A-11E, FIGS. 12A-12D, FIGS. 13A-13E, FIGS. 14A-14D and FIGS. 15A-15D illustrate cross-sectional views of structures obtained during the fabrication process of the interconnection layer carrying structure 120.

Figure 10A:
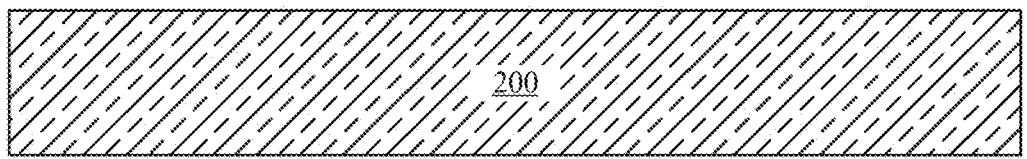
FIG. 10A illustrates a cross-sectional view of structures obtained during a fabrication process of the interconnection layer carrying structure according to an exemplary embodiment of the present invention.

As shown in FIG. 10A, the fabrication process of the interconnection layer carrying structure 120 can include a step of preparing an support substrate 200. In the described embodiment, the support substrate 200 prepared by this step is a glass wafer or panel and the following process is described assuming laser de-bonding process. However, in case of a mechanical or a thermal de-bonding process, other substrates such as a silicon wafer can be used as the support substrate 200. The thickness of the support substrate 200 can range from several hundreds of micrometers to several millimeters, for example.

Figure 10B:
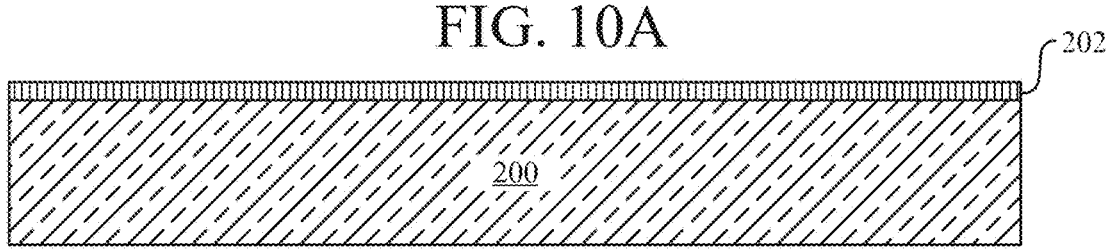
FIG. 10B illustrates a cross-sectional view of structures obtained during a fabrication process of the interconnection layer carrying structure according to an exemplary embodiment of the present invention.

As shown in FIG. 10B, the fabrication process can include a step of applying a release layer 202 on the support substrate 200. The release layer 202 can be formed by virtually any means, including, for example, spin coating. In one embodiment, the thickness of the release layer 202 can be approximately or less than 1 micrometer, for example. After the formation of the release layer 202 is complete, an interconnection layer part is built on the release layer 202 through steps described below.

Figure 10C:
FIG. 10C illustrates a cross-sectional view of structures obtained during a fabrication process of the interconnection layer carrying structure according to an exemplary embodiment of the present invention.

As shown in FIG. 10C, the fabrication process can include a step of forming a first seed metal layer 204 onto the release layer 202. The first seed metal layer 204 can be formed by virtually any means, including sputtering. In a particular embodiment, a stack of a titanium layer and a copper layer (Ti/Cu where Ti is the bottom in the stack) are formed on the release layer 202 by sputtering to form the first seed metal layer 204. In one embodiment, the titanium layer can have several tens of nanometers thickness and the copper layer can have several hundreds of nanometers thickness. The same applies to other seed layers that will be described below.

Figure 10D:
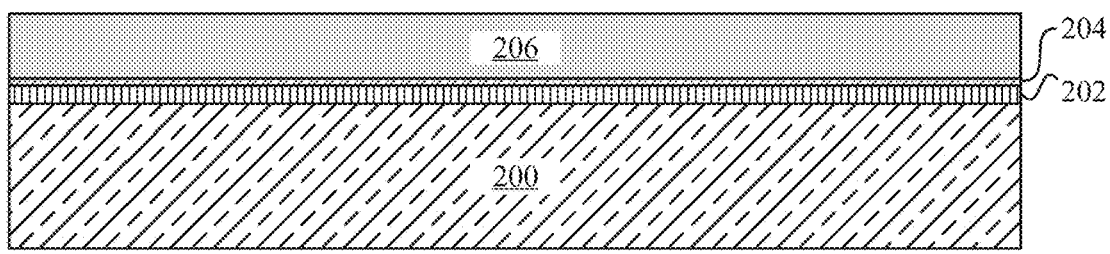
FIG. 10D illustrates a cross-sectional view of structures obtained during a fabrication process of the interconnection layer carrying structure according to an exemplary embodiment of the present invention.

As shown in FIG. 10D, the fabrication process can include a step of depositing a plating resist 206 onto the first seed metal layer 204. In a particular embodiment, the plating resist 206 can be made of any one of photosensitive resins. The thickness of the plating resist 206 can range from 10 micrometers to 50 micrometers. The plating resist 206 can be formed by virtually any means, including, for example, spin coating. The film type resist can also be used as well as the liquid type resist. In a case of the film type resist, the plating resist 206 is made by lamination process. The same applies to other plating resists that will be described below.

Figure 10E:
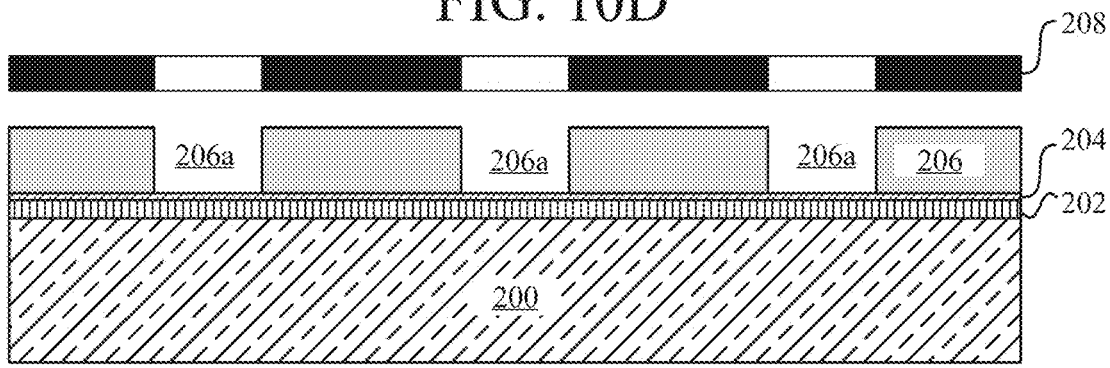
FIG. 10E illustrates a cross-sectional view of structures obtained during a fabrication process of the interconnection layer carrying structure according to an exemplary embodiment of the present invention.

As shown in FIG. 10E, the fabrication process can include a step of making a plurality of openings 206a into the plating resist 206. The openings 206a correspond to the pads 140, 141, 142 shown in FIG. 2. The openings 206a can be fabricated by virtually any means, including, for example, photolithography. In a particular embodiment, the photosensitive resin deposited by spin coating is exposed through a photomask 208 and developed to make the openings 206a in the plating resist 206. Note that the fabrication process is described using a specific type of resist or photosensitive resin in terms of patterning. For example, FIG. 10E shows a case of using a positive type resist. However, the type of the resist or photosensitive resin is not limited to the specific type shown in the drawings. Positive and negative type resist or photosensitive resin can be employed as well. The same applies to other resists and photosensitive resins that will be described below.

Figure 10F:
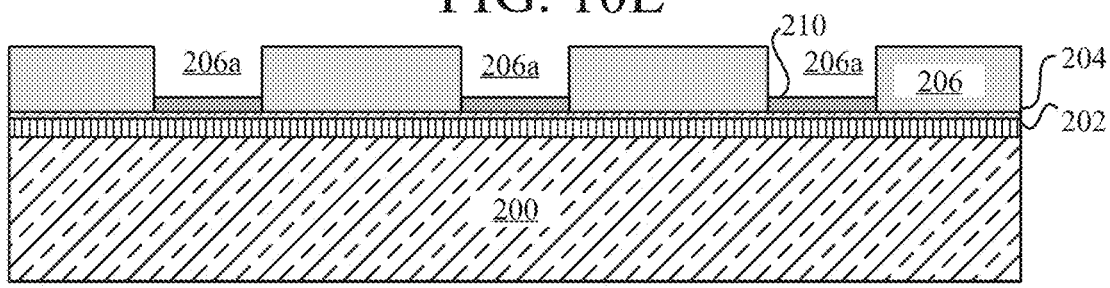
FIG. 10F illustrates a cross-sectional view of structures obtained during a fabrication process of the interconnection layer carrying structure according to an exemplary embodiment of the present invention.

As shown in FIG. 10F, the fabrication process can further include a step of forming barrier metal layer 210 onto the first seed metal layer 204 at positions of the openings 206a of the plating resist 206. In a particular embodiment, the barrier metal layer 210 is an Au/Pd/Ni metal stack, which can include a gold layer on the first seed metal layer 204, a palladium layer on the gold layer and a nickel layer on the palladium layer. The gold layer becomes top when the resultant interconnection layer 130 is transferred onto the organic base substrate 110 during the fabrication process of the interconnection substrate 100. The barrier metal layer 210 can be formed on the first seed metal layer 204 by virtually any metallization process, which can include, for example, electrolytic plating.

Figure 11A:
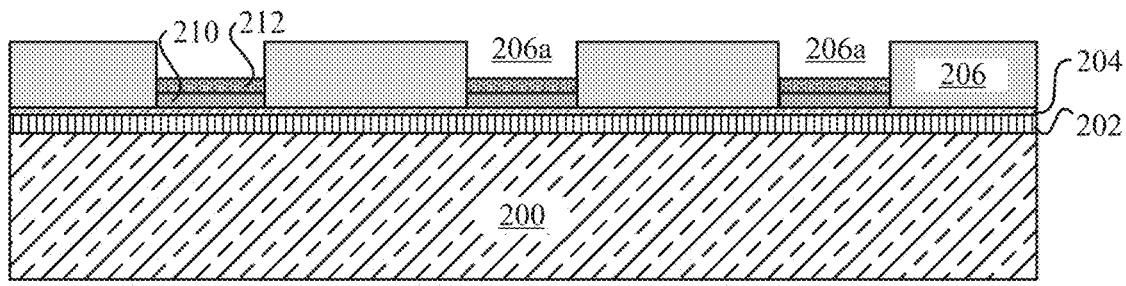
FIG. 11A illustrates a cross-sectional view of structures obtained during the fabrication process of the interconnection layer carrying structure according to the exemplary embodiment of the present invention.

As shown in FIG. 11A, the fabrication process can include a step of depositing a first conductive layer 212 on the barrier metal layer 210. The first conductive layer 212 can be formed by virtually any means, including, for example, electroplating. In a particular embodiment, a metal copper is deposited by electroplating to form the first conductive layer 212. The same applies to other conductive layers that will be described below.

Figure 11B:
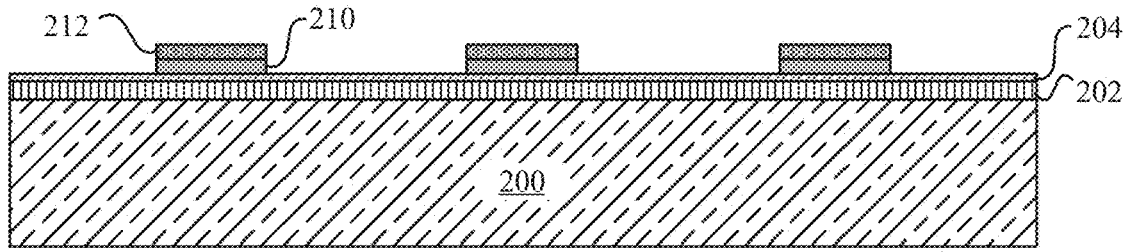
FIG. 11B illustrates a cross-sectional view of structures obtained during the fabrication process of the interconnection layer carrying structure according to the exemplary embodiment of the present invention.
Figure 11C:
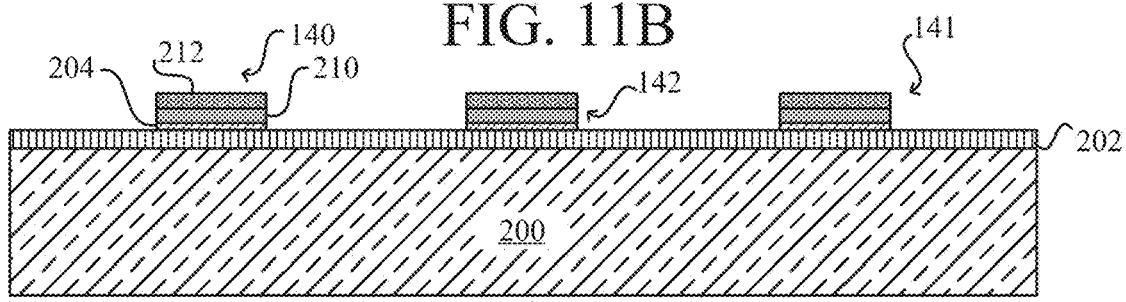
FIG. 11C illustrates a cross-sectional view of structures obtained during the fabrication process of the interconnection layer carrying structure according to the exemplary embodiment of the present invention.

As shown in FIG. 11B, the fabrication process can include a step of removing the plating resist 206 from the first seed metal layer 204. As shown in FIG. 11C, the fabrication process can include a step of removing portions of the first seed metal layer 204 that are exposed from the metal stacks 210, 212.

By performing the steps shown in FIGS. 10C-10F and FIGS. 11A-11C, conductive material is patterned to form a set of side connection pads 140 and bond pads 141, 142 formed on the release layer 202.

Figure 11D:
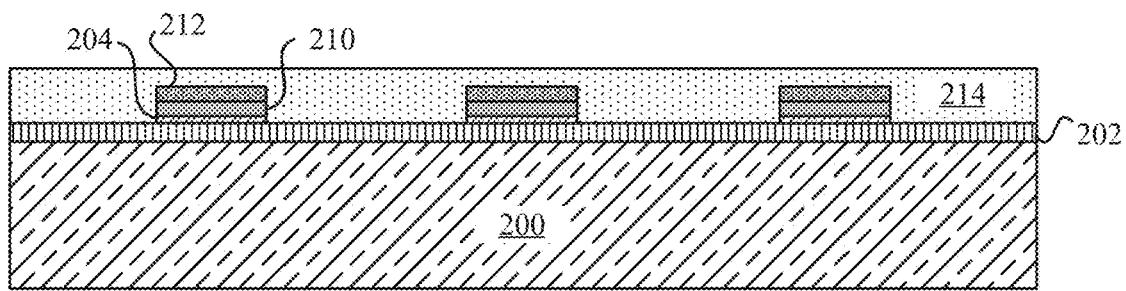
FIG. 11D illustrates a cross-sectional view of structures obtained during the fabrication process of the interconnection layer carrying structure according to the exemplary embodiment of the present invention.

As shown in FIG. 11D, the fabrication process can include a step of forming a first organic insulation part 214 on the release layer 202 so as to embed the set of the pads 140, 141, 142 (including the first seed metal layer 204, the barrier metal layer 210 and the first conductive layer 212). In a particular embodiment, the first organic insulation part 214 is made of any one of photosensitive insulating resins. The thickness of the first organic insulation part 214 can range from several micrometers to several tens of micrometers.

The first organic insulation part 214 can be formed by virtually any means, including, for example, spin coating. The film type resin can also be used as well as the liquid type resin. In case of the film type resin, the first organic insulation part 214 is made by lamination process. The same applies to other organic insulation parts that will be described below.

Figure 11E:
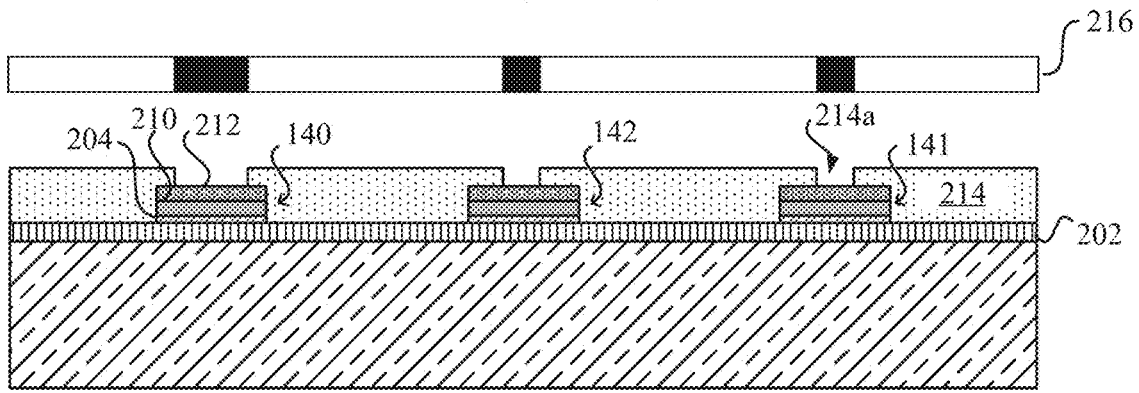
FIG. 11E illustrates a cross-sectional view of structures obtained during the fabrication process of the interconnection layer carrying structure according to the exemplary embodiment of the present invention.

As shown in FIG. 11E, the fabrication process can include a step of exposing and developing the first organic insulation part 214 so as to have a plurality of via openings 214a at the positions of the pads 140, 141, 142. The via openings 214a can be fabricated by virtually any means, including, for example, photolithography. In a particular embodiment, the photosensitive insulating resin deposited by spin coating is exposed through a photomask 216 and developed to make the via opening 214a. FIG. 11E shows a case of using the negative type resist.

Figure 12A:
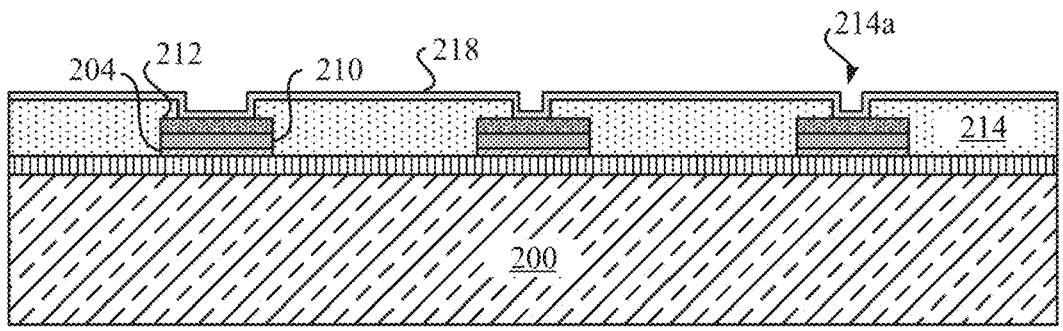
FIG. 12A illustrates a cross-sectional view of structures obtained during the fabrication process of the interconnection layer carrying structure according to the exemplary embodiment of the present invention.

As shown in FIG. 12A, the fabrication process can include a step of forming a second seed metal layer 218 onto the top surface of the first organic insulation part 214 and exposed surfaces of the first conductive layer 212 in the via openings 214a.

Figure 12B:
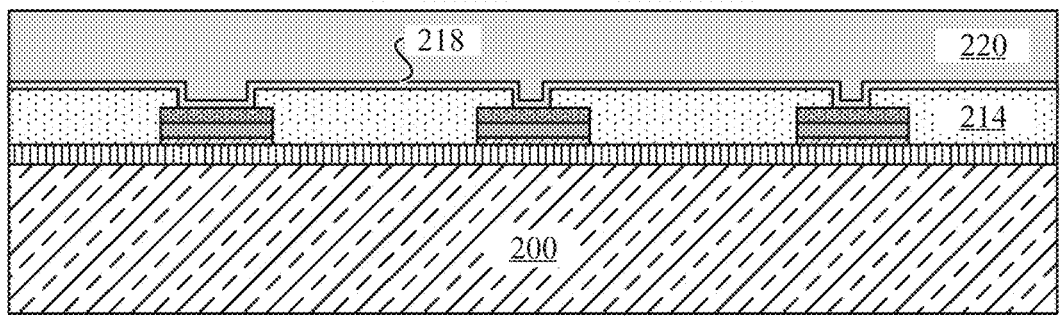
FIG. 12B illustrates a cross-sectional view of structures obtained during the fabrication process of the interconnection layer carrying structure according to the exemplary embodiment of the present invention.
Figure 12C:
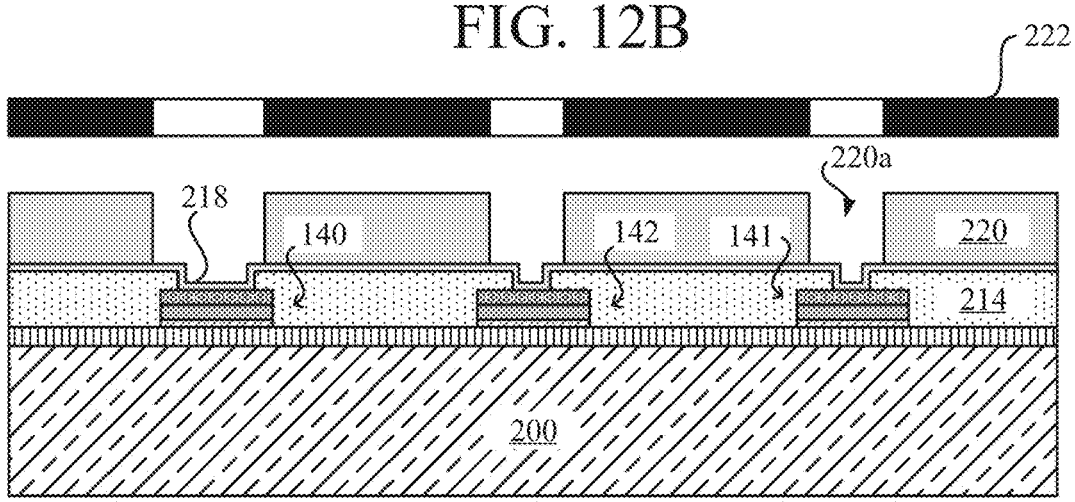
FIG. 12C illustrates a cross-sectional view of structures obtained during the fabrication process of the interconnection layer carrying structure according to the exemplary embodiment of the present invention.

As shown in FIG. 12B, the fabrication process can include a step of depositing a plating resist 220 onto the second seed metal layer 218. As shown in FIG. 12C, the fabrication process can include a step of patterning an opening pattern 220a in the plating resist 220 using a photomask 222. The opening pattern 220a includes a wiring or trace pattern for the bond pad 142. The opening pattern 214a can be fabricated by virtually any means, including, for example, photolithography. FIG. 12C shows a case of using a positive-type resist.

Figure 12D:
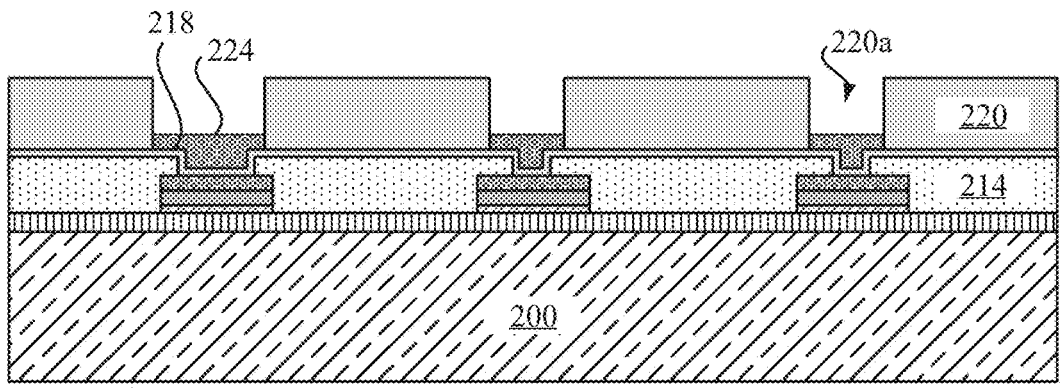
FIG. 12D illustrates a cross-sectional view of structures obtained during the fabrication process of the interconnection layer carrying structure according to the exemplary embodiment of the present invention.
Figure 13A:
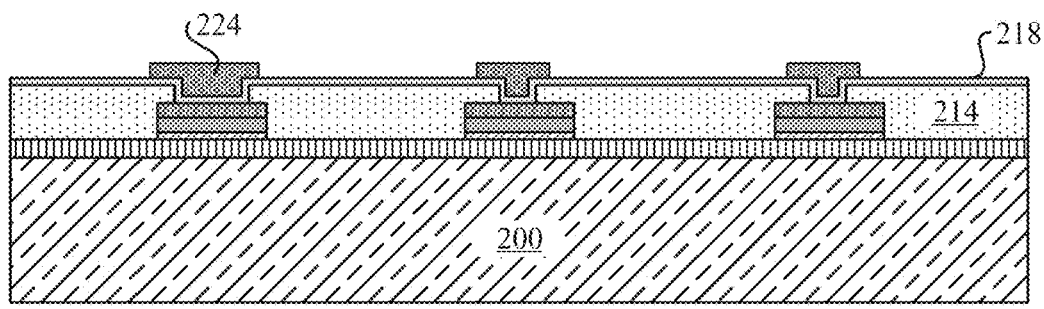
FIG. 13A illustrates a cross-sectional view of structures obtained during the fabrication process of the interconnection layer carrying structure according to the exemplary embodiment of the present invention.
Figure 13B:
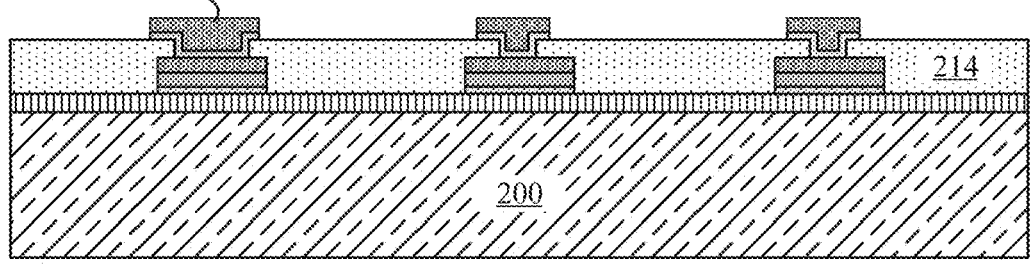
FIG. 13B illustrates a cross-sectional view of structures obtained during the fabrication process of the interconnection layer carrying structure according to the exemplary embodiment of the present invention.

As shown in FIG. 12D, the fabrication process can include a step of depositing a second conductive layer 224 on regions of the second seed metal layer 218 where there is no plating resist. As shown in FIG. 13A, the fabrication process can include a step of removing the plating resist 220 from the second seed metal layer 218. As shown in FIG. 13B, the fabrication process can include a step of removing portions of the second seed metal layer 218 that are exposed from the second conductive layer 224.

By performing the steps shown in FIG. 11E, FIGS. 12A-12D and FIGS. 13A-13B, conductive material is patterned to form a trace for connecting the bond pad 142 and a corresponding bond pad.

Figure 13C:
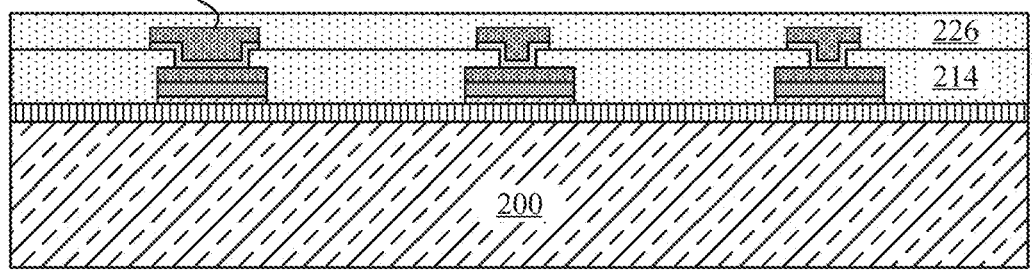
FIG. 13C illustrates a cross-sectional view of structures obtained during the fabrication process of the interconnection layer carrying structure according to the exemplary embodiment of the present invention.
Figure 13D:
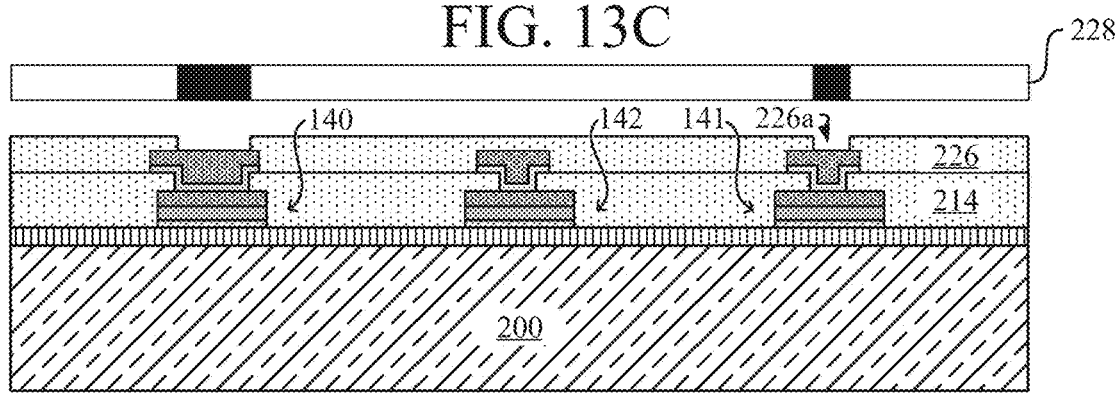
FIG. 13D illustrates a cross-sectional view of structures obtained during the fabrication process of the interconnection layer carrying structure according to the exemplary embodiment of the present invention.

As shown in FIG. 13C, the fabrication process can include a step of depositing a second organic insulation layer 226 on the first organic insulation part 214 so as to embed the second conductive layer 224. As shown in FIG. 13D, the fabrication process can include a step of exposing and developing the second organic insulation layer 226 so as to have a plurality of via openings 226a at the positions of the pads 140, 141. Since the bond pad 142 is isolated from the pads 140, 141, no opening is formed at the positions of the pads 142. FIG. 13D shows a case of using the negative type resist.

Figure 13E:
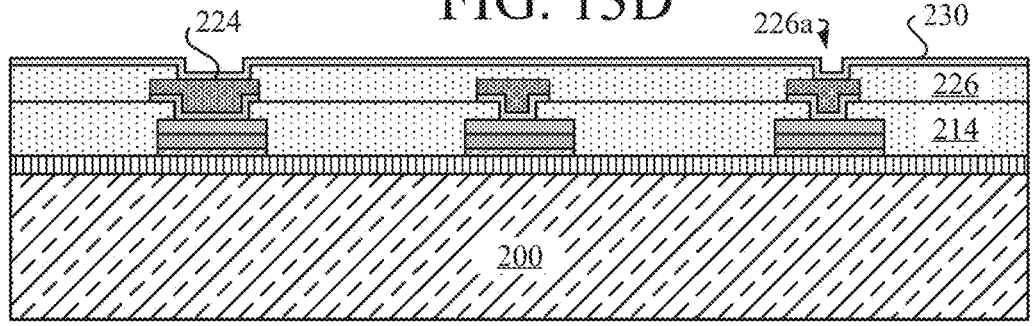
FIG. 13E illustrates a cross-sectional view of structures obtained during the fabrication process of the interconnection layer carrying structure according to the exemplary embodiment of the present invention.

As shown in FIG. 13E, the fabrication process can include a step of forming a third seed metal layer 230 onto the top surface of the second organic insulation layer 226 and exposed surfaces of the second conductive layer 224 in the via openings 226a.

Figure 14A:
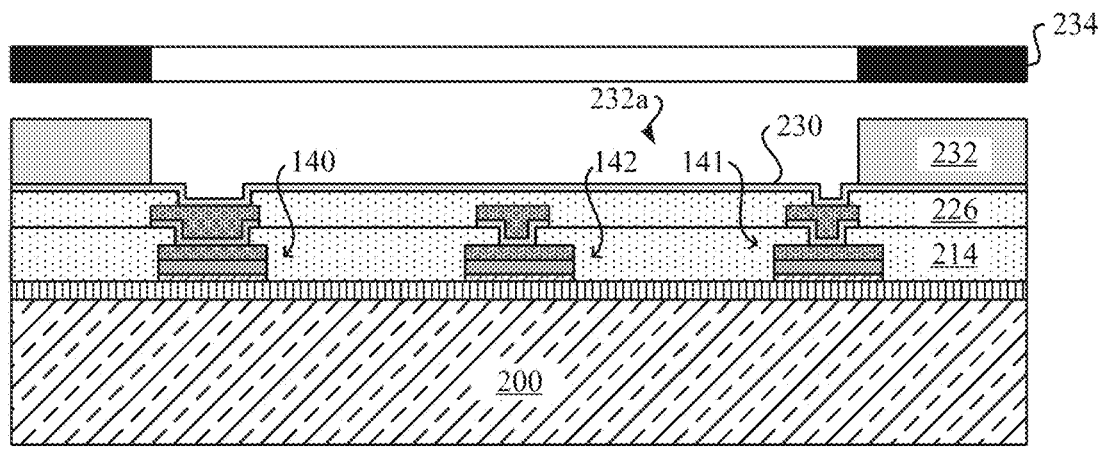
FIG. 14A illustrates a cross-sectional view of structures obtained during the fabrication process of the interconnection layer carrying structure according to the exemplary embodiment of the present invention.

As shown in FIG. 14A, the fabrication process can include a step of patterning a plating resist 232 on the third seed metal layer 230 by using a photomask 234. The plating resist 232 has an opening pattern 232a that includes a wiring or trace pattern for the pad 140, 141. FIG. 14A shows a case of using the positive type resist.

Figure 14B:
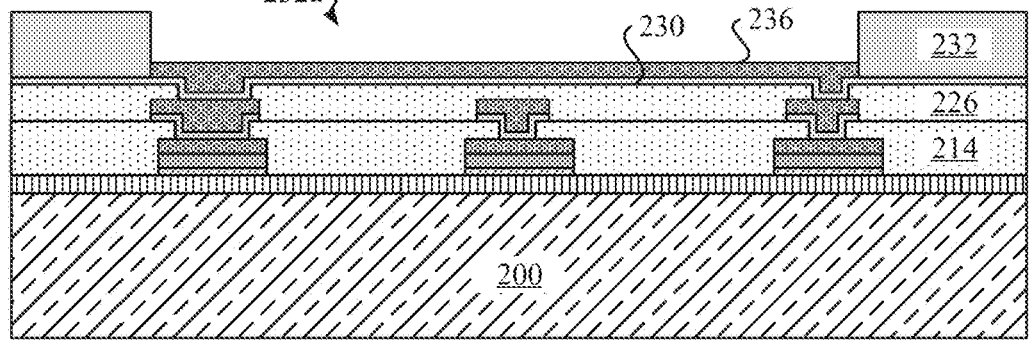
FIG. 14B illustrates a cross-sectional view of structures obtained during the fabrication process of the interconnection layer carrying structure according to the exemplary embodiment of the present invention.
Figure 14C:
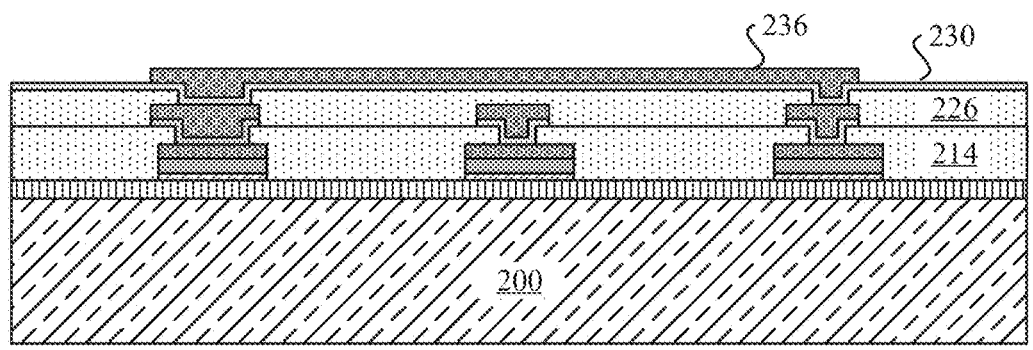
FIG. 14C illustrates a cross-sectional view of structures obtained during the fabrication process of the interconnection layer carrying structure according to the exemplary embodiment of the present invention.
Figure 14D:
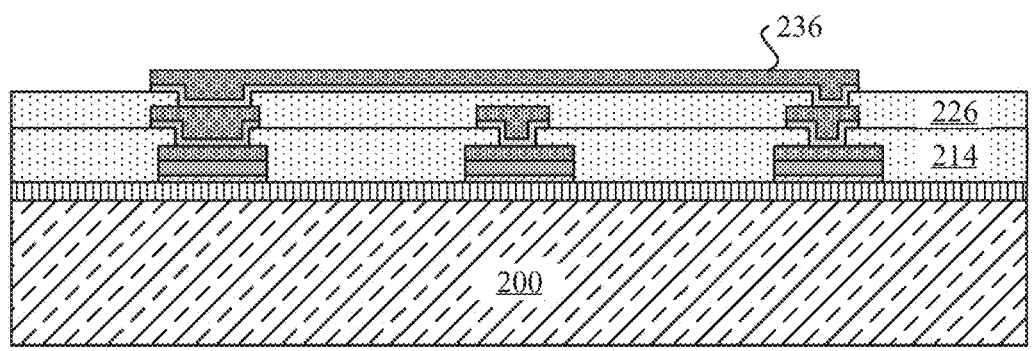
FIG. 14D illustrates a cross-sectional view of structures obtained during the fabrication process of the interconnection layer carrying structure according to the exemplary embodiment of the present invention.

As shown in FIG. 14B, the fabrication process can include a step of depositing a third conductive layer 236 on regions of the third seed metal layer 230 where there is no plating resist. As shown in FIG. 14C, the fabrication process can include a step of removing the plating resist 232 from the third seed metal layer 230. As shown in FIG. 14D, the fabrication process can include a step of removing portions of the third seed metal layer 230 that are exposed from the third conductive layer 236.

By performing the steps shown in FIGS. 13C-13E and FIGS. 14A-14D, conductive material is patterned to form wiring for connecting the side connection pad 140 and a corresponding bond pad 141.

Figure 15A:
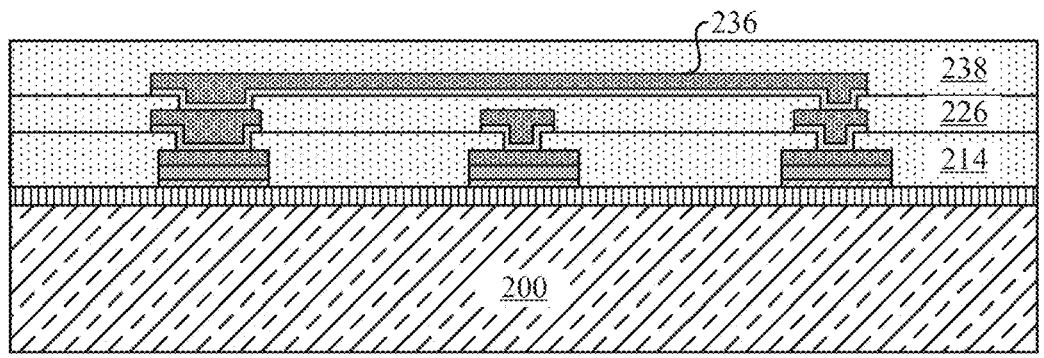
FIG. 15A illustrates a cross-sectional view of structures obtained during the fabrication process of the interconnection layer carrying structure according to the exemplary embodiment of the present invention.
Figure 15B:
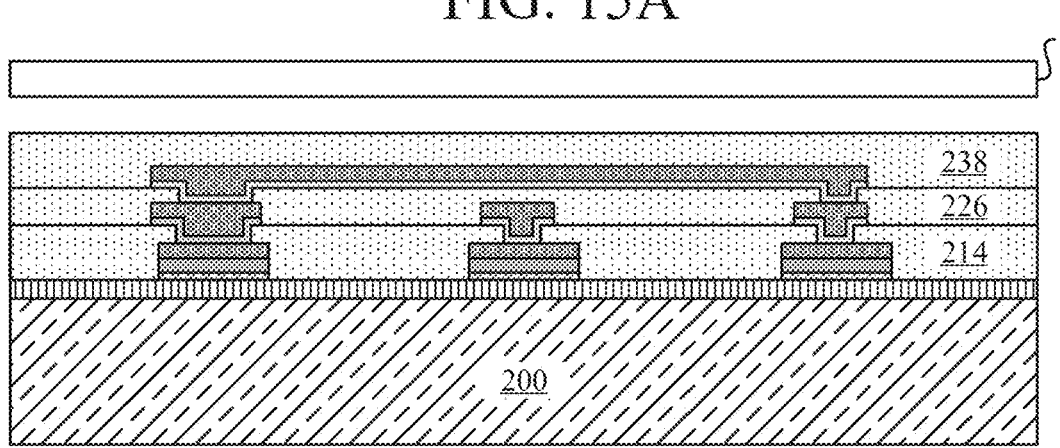
FIG. 15B illustrates a cross-sectional view of structures obtained during the fabrication process of the interconnection layer carrying structure according to the exemplary embodiment of the present invention.

As shown in FIG. 15A, the fabrication process can include a step of depositing a third organic insulation layer 238 on the second organic insulation layer 226 to embed the third conductive layer 236. As shown in FIG. 15B, the fabrication process can include a step of exposing and developing the third organic insulation layer 238 by using a photomask 240.

Figure 15C:
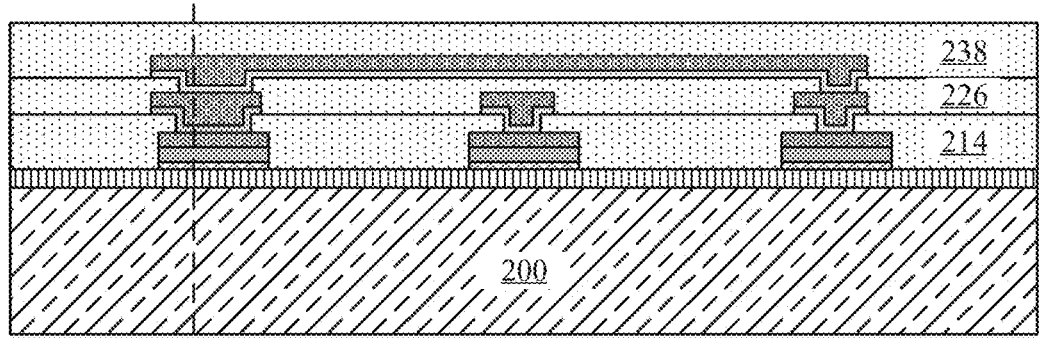
FIG. 15C illustrates a cross-sectional view of structures obtained during the fabrication process of the interconnection layer carrying structure according to the exemplary embodiment of the present invention.
Figure 15D:
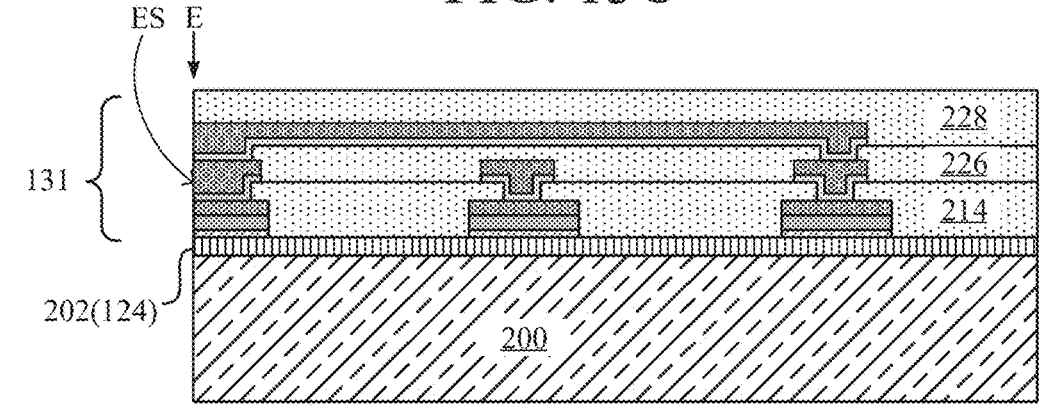
FIG. 15D illustrates a cross-sectional view of structures obtained during the fabrication process of the interconnection layer carrying structure according to the exemplary embodiment of the present invention.

As shown in FIG. 15C, the fabrication process can further include a step of cutting the support substrate 200 together with its superstructure (including the release layer 202) by using a dicing blade to obtain an individual structure shown in FIG. 15D, which is almost identical to the interconnection layer carrying structure 120 shown in FIG. 2. The cutting line (a dashed line in FIG. 15C) corresponds to one edge E of the interconnection layer carrying structure 120 and passes a position where the metal stack corresponding to the side connection pad 140 is split. Cutting the support substrate 200 completes fabrication of the set of the side connection pads 140.

Since the outline of the interconnection layer part 131 is defined by a cutting process, the edge of the interconnection layer part 131 has a straight shape and the set of side connection pads 140 is formed in a line, and accordingly the set of conductive pads 114 as a counterpart is also formed in a line.

Note that the fabrication process can further include a step of forming a barrier metal layer on the edge surface ES of the side connection pads 140, by virtually any metallization process, which can include, for example, electroless plating. In a particular embodiment where the electroless plating is employed, exposed edge surfaces ES of the side connection pads 140 are plated selectively to form the barrier metal layer on the edge surface ES of the side connection pads 140. The formation of the barrier metal layer can be preferably conducted before attachment of the interconnection layer part 131 to the organic base substrate in order to avoid occurrence of voids owing from pad size difference between the interconnection layer part 131 and the organic base substrate 110. Although there is a difference in compositions and additives of the barrier metal layer between the top surface TS and the edge surface ES, the barrier metal layer of the edge surface ES is preferably the same as that of the top surface TS in terms of combination of metal materials to make diffusion rate of solder elements homogeneous, which would alleviate local formation of alloy and stress concentration. For example, when the barrier metal for the top surface TS is a Ni/Au stack, a Ni/Au stack is preferably employed for the edge surface ES.

The interconnection layer carrying structure 120 obtained by this process can be passed to a subsequent process such as interconnection substrate fabrication shown in the series of FIGS. 3A-3C and FIGS. 4A-4C. In one embodiment, the interconnection layer carrying structure 120 segmented from the glass wafer or panel by dicing as shown in FIG. 15D can be provided to next in a production chain. The interconnection layer part 131 is provided as a form of a tape that is formed by organic material and held by the support substrate 122 as rigid backing material.

The interconnection layer carrying structure 120 obtained by this process can have two conductive layers (other than the pad body) with an interlayer of the organic insulation material. However, the number of conductive layers is not limited. By repeatedly performing a series of steps of (i) depositing an organic insulation layer, (ii) exposing and developing the organic insulation layer, (iii) forming a seed layer, (iv) depositing a plating resist, (v) exposing and developing the plating resist, (vi) depositing a conductive layer, (vii) removing the plating resist and (viii) removing the seed layer, each conductive layer is stacked with an interlayer of the organic insulation material in one-by-one manner.

The aforementioned fabrication process of the interconnection layer carrying structure 120 is cost effective and it allows us to increase the number of interconnection layer carrying structures that are cut from a single wafer or panel.

Hereinafter, further referring to FIGS. 16A-16D, FIGS. 17A-17C, FIGS. 18A-18D, FIGS. 19A-19D and FIGS. 20A-20C together with FIGS. 10A-10F and FIGS. 11A-11D, an alternative process for fabricating an interconnection layer carrying structure according to other exemplary embodiment of the present invention is described. FIGS. 10A-10F, FIGS. 11A-11D, FIGS. 16A-16D, FIG. 17A-17C, FIGS. 18A-18D, FIGS. 19A-19D and FIGS. 20A-20C illustrate cross-sectional views of structures obtained during the alternative fabrication process of the interconnection layer carrying structure 120.

Since the steps shown in a series of FIGS. 10A-10F and FIGS. 11A-11D are the same as the aforementioned exemplary embodiment, hereinafter, description will be made from the step of FIG. 16A. By performing the steps of FIGS. 10A-10F and FIGS. 11A-11D, a structure including a support substrate 200; a release layer 202 formed on the support substrate 200; a set of pads 140, 141, 142 (including a first seed metal layer 204, a barrier metal layer 210 and a first conductive layer 212) formed on release layer 202; and a first organic insulation part 214 that is formed on the release layer 202 but is not exposed and developed yet, is obtained.

Figure 16A:
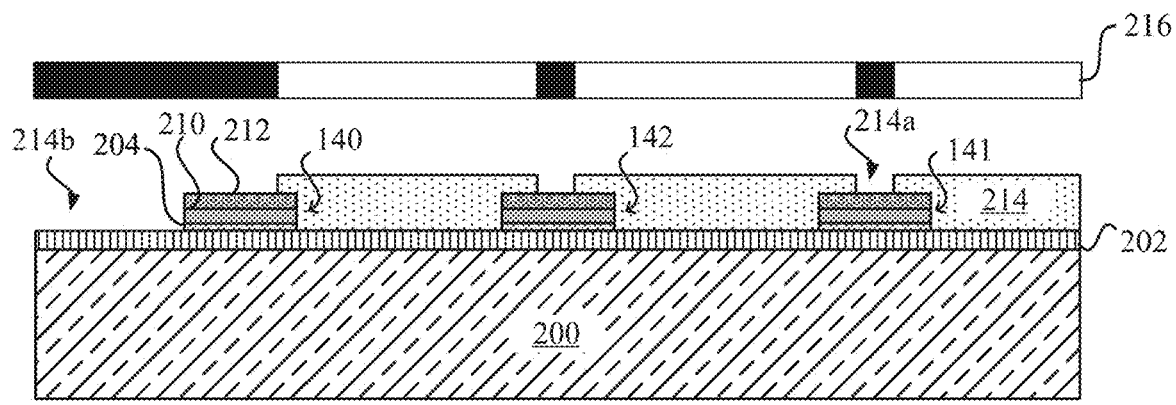
FIG. 16A illustrates a cross-sectional view of structures obtained during a fabrication process of the interconnection layer carrying structure according to other exemplary embodiment of the present invention.

As shown in FIG. 16A, the fabrication process can include a step of exposing and developing the first organic insulation part 214 so as to have a plurality of a via openings 214a at the positions of the pads 140, 141, 142 and to expose one edge of the side connection pad 140 as indicated by an opening space 214b in FIG. 16A. FIG. 16A shows a scenario in which a negative type resist is used.

Figure 16B:
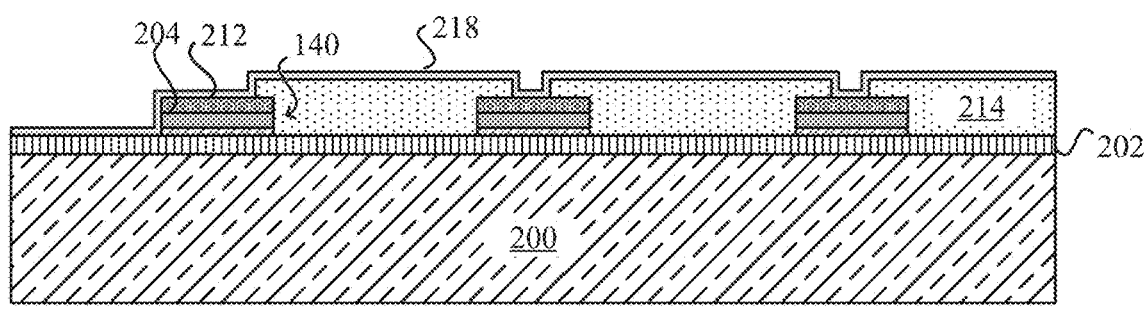
FIG. 16B illustrates a cross-sectional view of structures obtained during a fabrication process of the interconnection layer carrying structure according to other exemplary embodiment of the present invention.

As shown in FIG. 16B, the fabrication process can include a step of forming a second seed metal layer 218 onto the top surface of the first organic insulation part 214, the exposed surfaces of the first conductive layer 212 in the via openings 214a and the opening space 214b and the exposed surface of the release layer 202 in the opening space 214b.

Figure 16C:
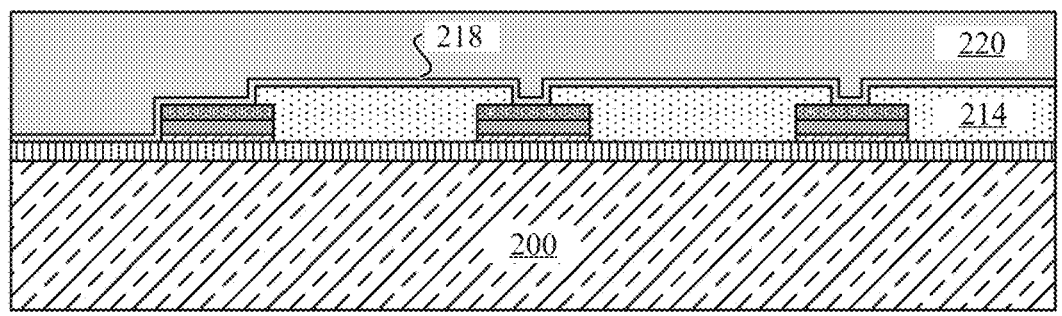
FIG. 16C illustrates a cross-sectional view of structures obtained during a fabrication process of the interconnection layer carrying structure according to other exemplary embodiment of the present invention.
Figure 16D:
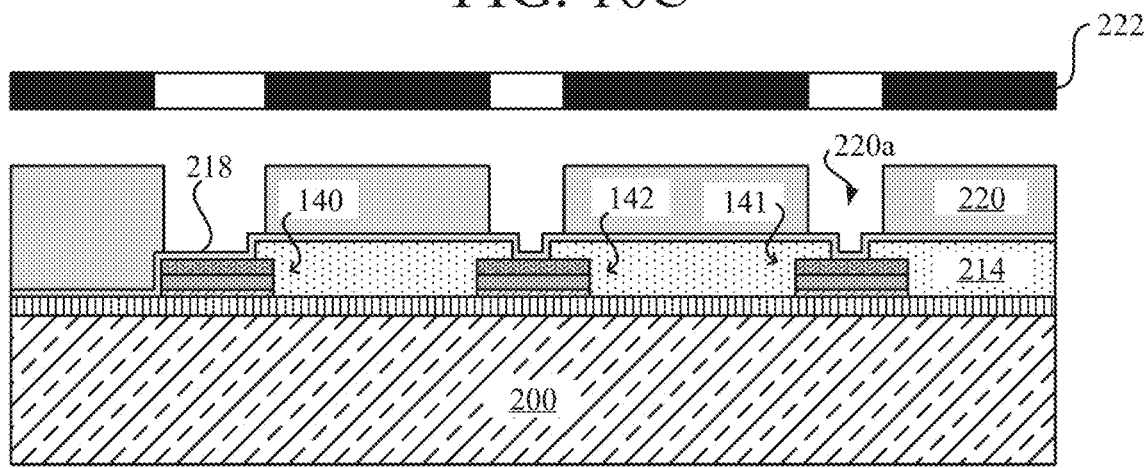
FIG. 16D illustrates a cross-sectional view of structures obtained during a fabrication process of the interconnection layer carrying structure according to other exemplary embodiment of the present invention.
Figure 17A:
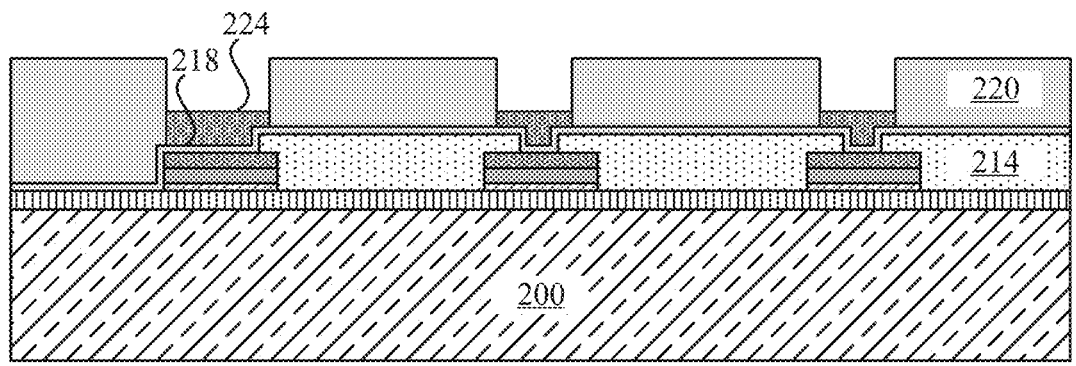
FIG. 17A illustrates a cross-sectional view of structures obtained during the fabrication process of the interconnection layer carrying structure according to the other exemplary embodiment of the present invention.
Figure 17B:
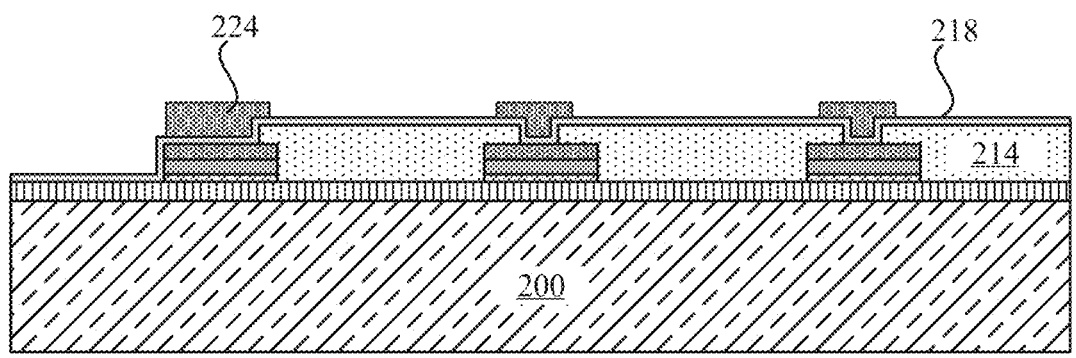
FIG. 17B illustrates a cross-sectional view of structures obtained during the fabrication process of the interconnection layer carrying structure according to the other exemplary embodiment of the present invention.
Figure 17C:
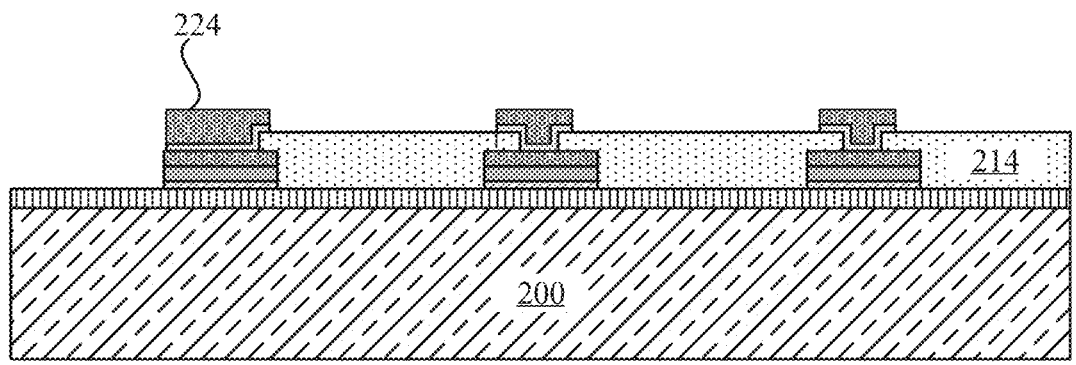
FIG. 17C illustrates a cross-sectional view of structures obtained during the fabrication process of the interconnection layer carrying structure according to the other exemplary embodiment of the present invention.

As shown in FIG. 16C, the fabrication process can include a step of depositing a plating resist 220 onto the second seed metal layer 218. As shown in FIG. 16D, the fabrication process can include a step of patterning an opening pattern 220a into the plating resist 220. As shown in FIG. 17A, the fabrication process can include a step of depositing a second conductive layer 224 on regions of the second seed metal layer 218 where there is no plating resist. As shown in FIG. 17B, the fabrication process can include a step of removing the plating resist 220 from the second seed metal layer 218. As shown in FIG. 17C, the fabrication process can include a step of removing portions of the second seed metal layer 218 that are exposed from the second conductive layer 224.

Figure 18A:
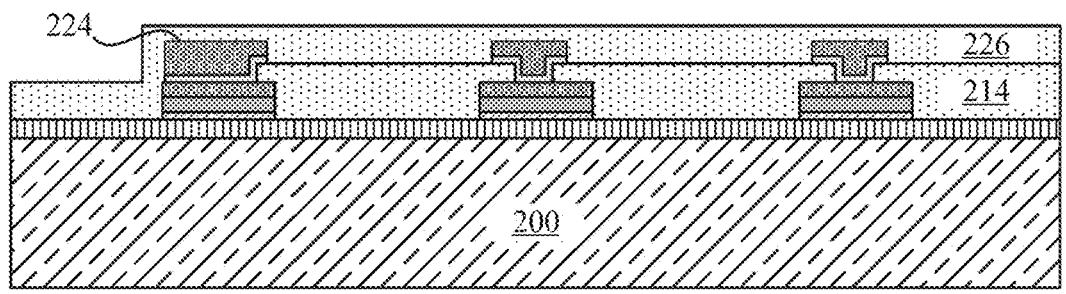
FIG. 18A illustrates a cross-sectional view of structures obtained during the fabrication process of the interconnection layer carrying structure according to the other exemplary embodiment of the present invention.
Figure 18B:
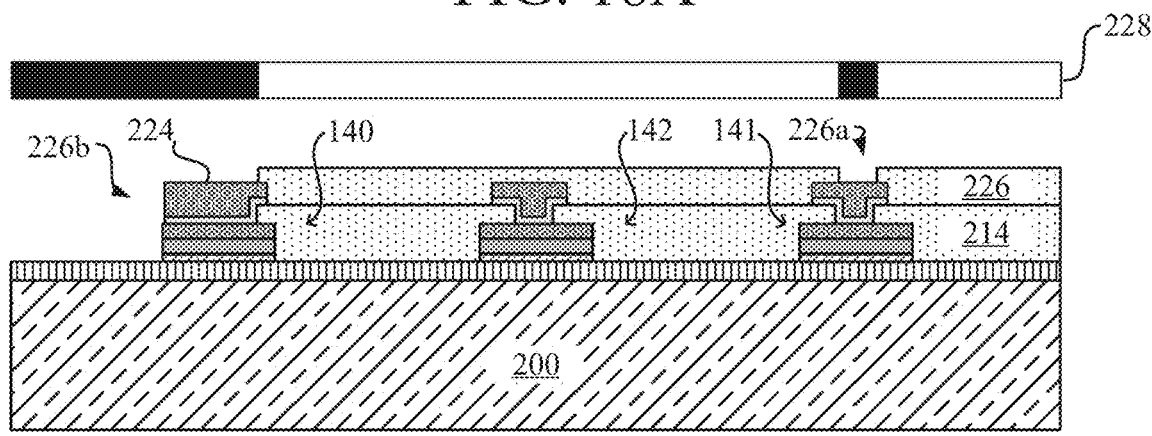
FIG. 18B illustrates a cross-sectional view of structures obtained during the fabrication process of the interconnection layer carrying structure according to the other exemplary embodiment of the present invention.

As shown in FIG. 18A, the fabrication process can include a step of depositing a second organic insulation layer 226 on the first organic insulation part 214 so as to embed the second conductive layer 224. As shown in FIG. 18B, the fabrication process can include a step of exposing and developing the second organic insulation layer 226 by using a photomask 228 so as to have a plurality of via openings 226a at the positions of the pads 140 and to expose one edge of the side connection pad 140 as indicated by an opening space 226b in FIG. 18B. FIG. 18B shows a case of using the negative type resist.

Figure 18C:
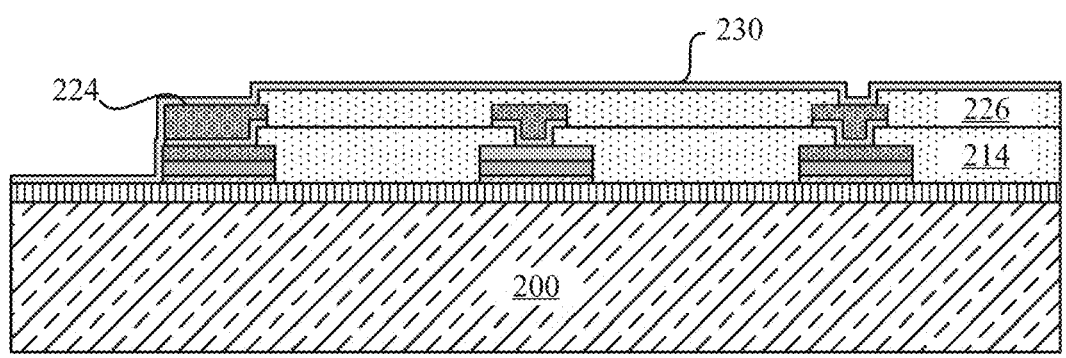
FIG. 18C illustrates a cross-sectional view of structures obtained during the fabrication process of the interconnection layer carrying structure according to the other exemplary embodiment of the present invention.

As shown in FIG. 18C, the fabrication process can include a step of forming a third seed metal layer 230 onto the top surface of the second organic insulation layer 226, the exposed surfaces of the second conductive layer 224 in the via openings 226a and the opening space 226b and the exposed surface of the release layer 202 in the opening space 226b.

Figure 18D:
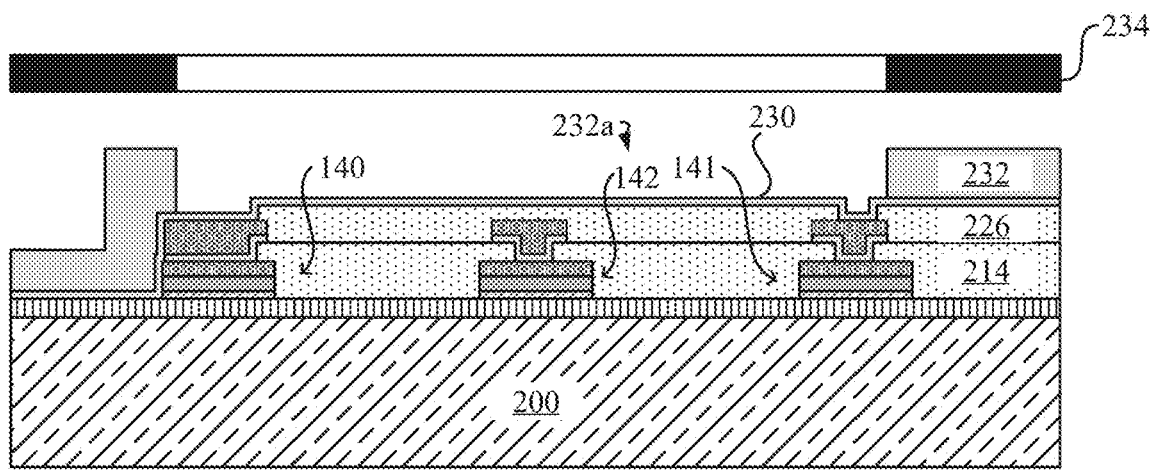
FIG. 18D illustrates a cross-sectional view of structures obtained during the fabrication process of the interconnection layer carrying structure according to the other exemplary embodiment of the present invention.

As shown in FIG. 18D, the fabrication process can include a step of patterning a plating resist 232 on the third seed metal layer 230 by using a photomask 234. The plating resist 232 has an opening pattern 232a that includes a wire pattern for the pad 140, 141. FIG. 18D shows a case of using the positive type resist.

Figure 19A:
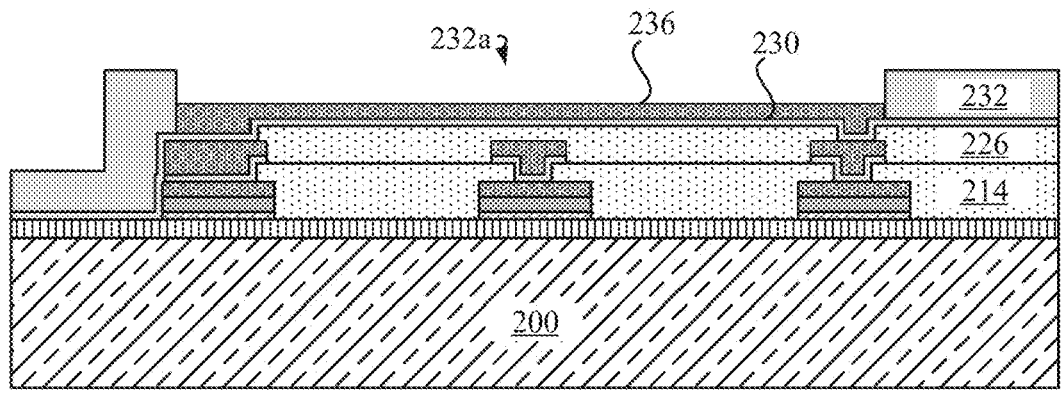
FIG. 19A illustrates a cross-sectional view of structures obtained during the fabrication process of the interconnection layer carrying structure according to the other exemplary embodiment of the present invention.
Figure 19B:
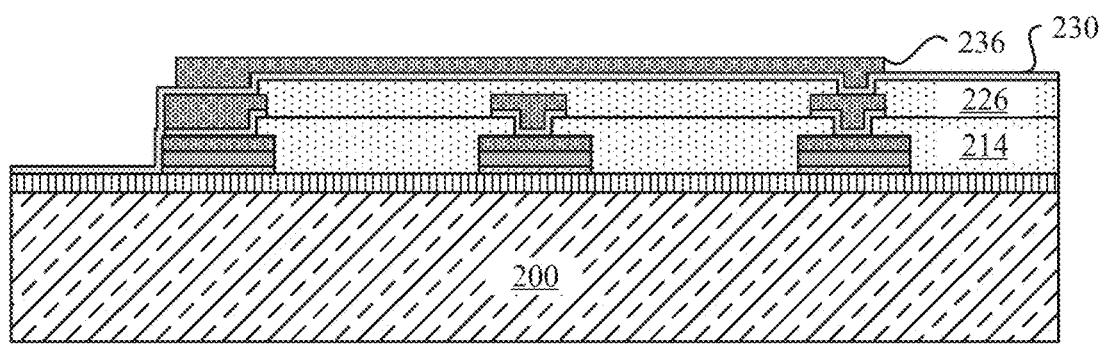
FIG. 19B illustrates a cross-sectional view of structures obtained during the fabrication process of the interconnection layer carrying structure according to the other exemplary embodiment of the present invention.
Figure 19C:
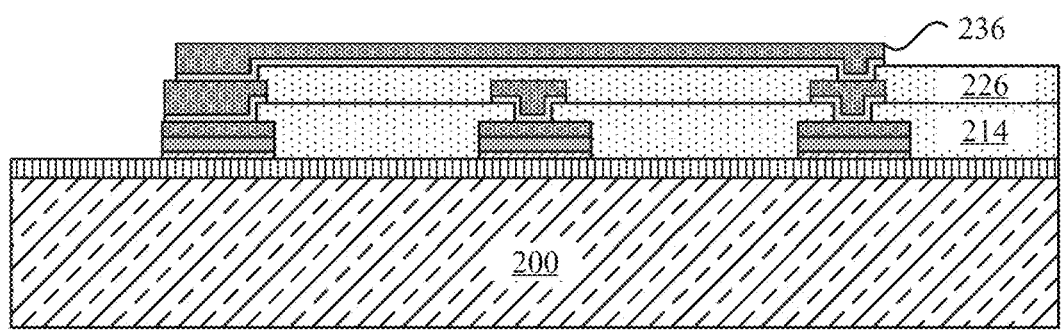
FIG. 19C illustrates a cross-sectional view of structures obtained during the fabrication process of the interconnection layer carrying structure according to the other exemplary embodiment of the present invention.

As shown in FIG. 19A, the fabrication process can include a step of depositing a third conductive layer 236 on regions of the third seed metal layer 230 where there is no plating resist. As shown in FIG. 19B, the fabrication process can include a step of removing the plating resist 232 from the third seed metal layer 230. As shown in FIG. 19C, the fabrication process can include a step of removing portions of the third seed metal layer 230 that are exposed from the third conductive layer 236.

Figure 19D:
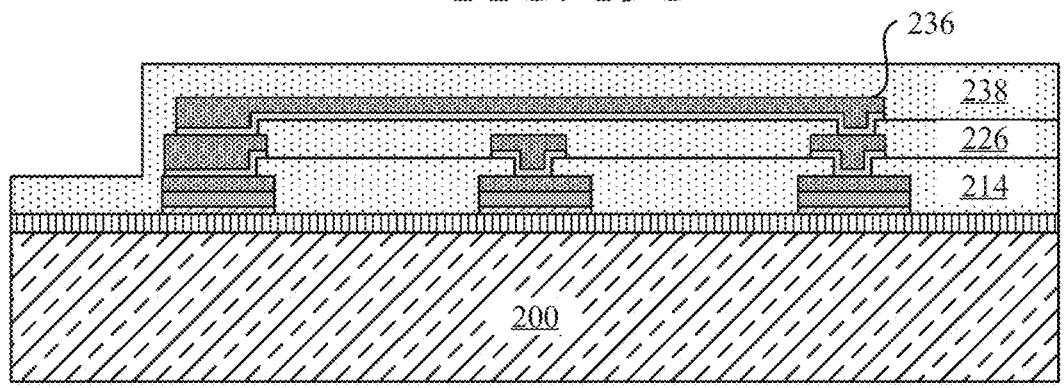
FIG. 19D illustrates a cross-sectional view of structures obtained during the fabrication process of the interconnection layer carrying structure according to the other exemplary embodiment of the present invention.
Figure 20A:
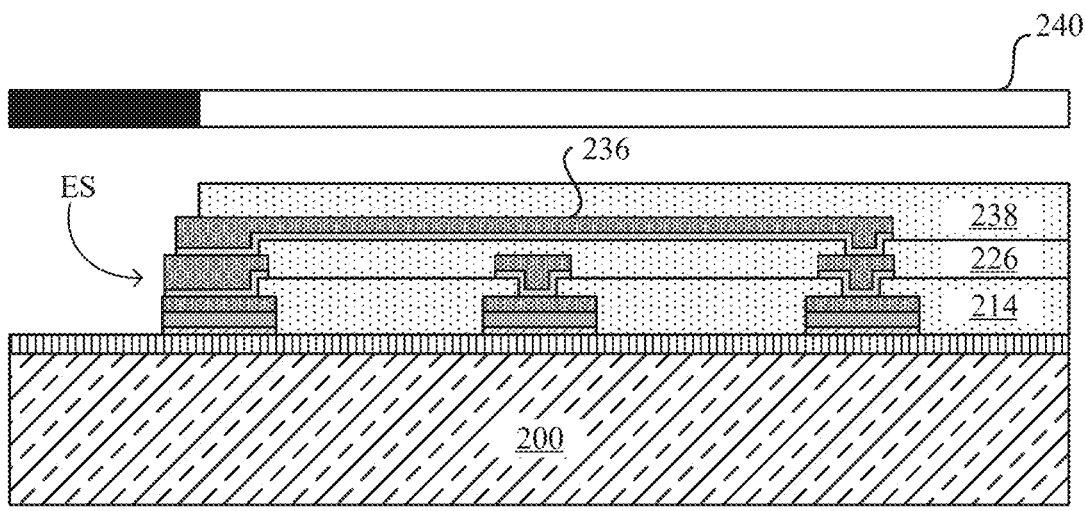
FIG. 20A illustrates a cross-sectional view of structures obtained during the fabrication process of the interconnection layer carrying structure according to the other exemplary embodiment of the present invention.

As shown in FIG. 19D, the fabrication process can include a step of depositing a third organic insulation layer 238 on the second organic insulation layer 226 to embed the third conductive layer 236. As shown in FIG. 20A, the fabrication process can include a step of exposing and developing the third organic insulation layer 238 by using a photomask 240 so as to expose the edge of the side connection pad 140.

The first organic insulation part 214, the second organic insulation layer 226 and the third organic insulation layer 238 are patterned so as to form an outline shape of the interconnection layer part 131 while exposing at least the edge surface ES of each side connection pad 140 from the organic insulation layers 214, 226, 238.

Note that the fabrication process can further include a step of forming a barrier metal layer on the edge surface ES of the side connection pads 140 by virtually any metallization process, which can include, for example, electroless plating. The formation of the barrier metal layer on the edge surface ES can be performed at any stage where the side connection pads 140 are formed and the edge surfaces ES of the side connection pads 140 are exposed. Hence, the formation of the barrier metal layer can be conducted after the following step of cutting the support substrate 200.

Figure 20B:
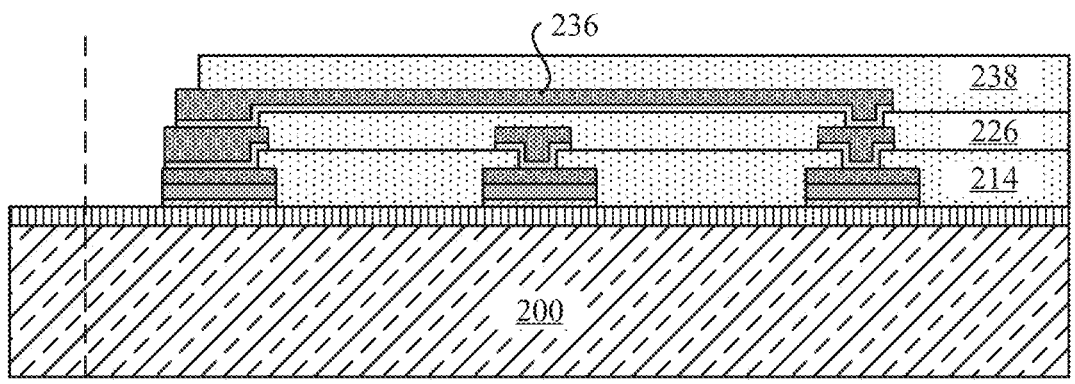
FIG. 20B illustrates a cross-sectional view of structures obtained during the fabrication process of the interconnection layer carrying structure according to the other exemplary embodiment of the present invention.
Figure 20C:
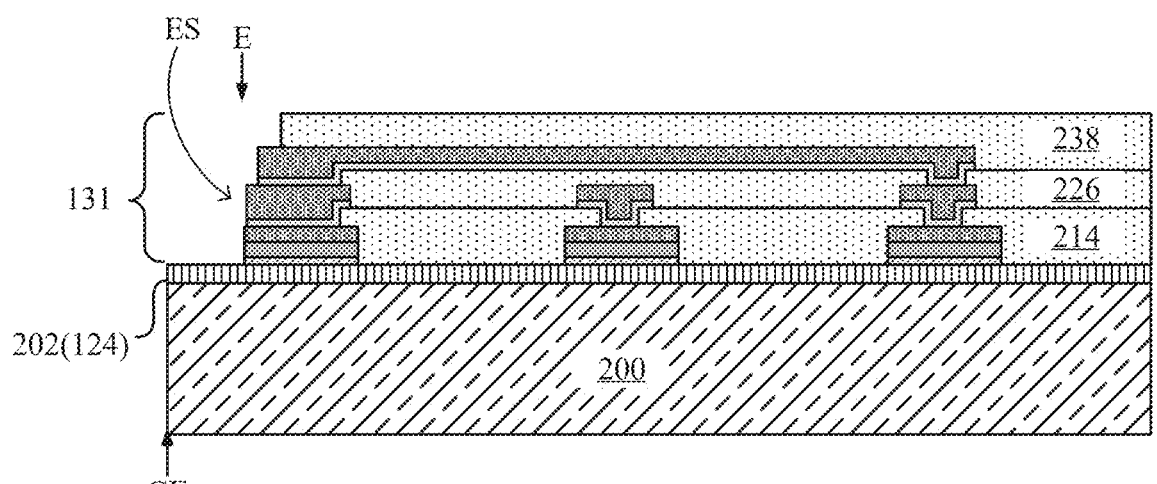
FIG. 20C illustrates a cross-sectional view of structures obtained during the fabrication process of the interconnection layer carrying structure according to the other exemplary embodiment of the present invention.

As shown in FIG. 20B, the fabrication process can further include a step of cutting the support substrate 200 with the release layer 202, to obtain an individual structure shown in FIG. 20C, which is almost identical to the interconnection layer carrying structure 120 shown in FIG. 5. The cutting line is located at a position away from one edge E of the interconnection layer part 131 and the set of the side connection pads 140.

Since the outline of the interconnection layer part 131 is defined by photolithography, the edge of the interconnection layer part 131 can have any appropriate shape. Also this alternative fabrication process is advantageous for controlling the height of the top surface 130a of the interconnection layer 130 since extended parts (or eaves) 122b of both edges extending outside the base part 122a can be easily fabricated. It improves yield and reliability of the interconnections between the terminal bumps 151, 152, 154 and bond pads 141, 142, 112 even if the density of the interconnections becomes higher and the pitch between the pads becomes narrower.

In a particular embodiment, the organic insulation layers 214, 226, 238 are patterned so that the edge E of the interconnection layer part 131 has a straight shape and the set of the side connection pads 140 is formed in a line, and accordingly the set of the corresponding conductive pads 114 is also formed in a line.

In a preferable embodiment, the organic insulation layers 214, 226, 238 are patterned so that the edge E of the interconnection layer part 131 has one or more curved or angular shapes to extend the length of the edge E and the set of the side connection pads 140 are formed along a contour of the one or more curved or angular shapes. Accordingly the set of the conductive pads 114 is also formed along a contour of the one or more curved or angular shapes.

Figure 21B:
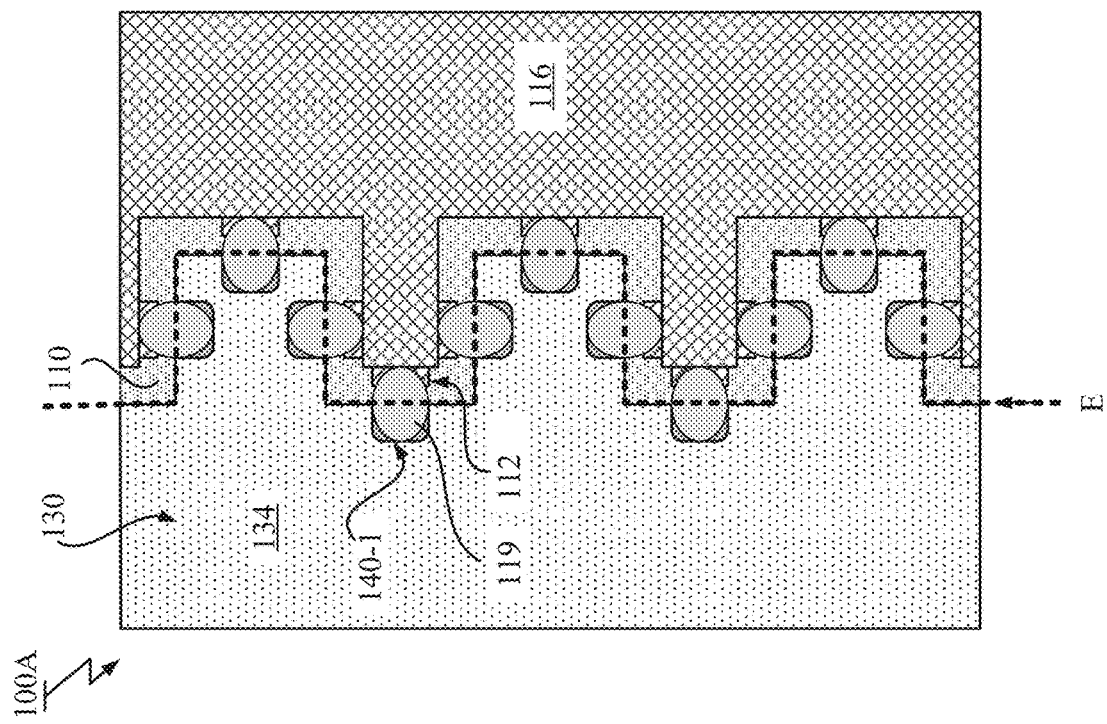
FIG. 21B illustrates a top view of an interconnection substrate without and with solder joints according to a particular embodiment of the present invention, respectively.
Figure 21A:
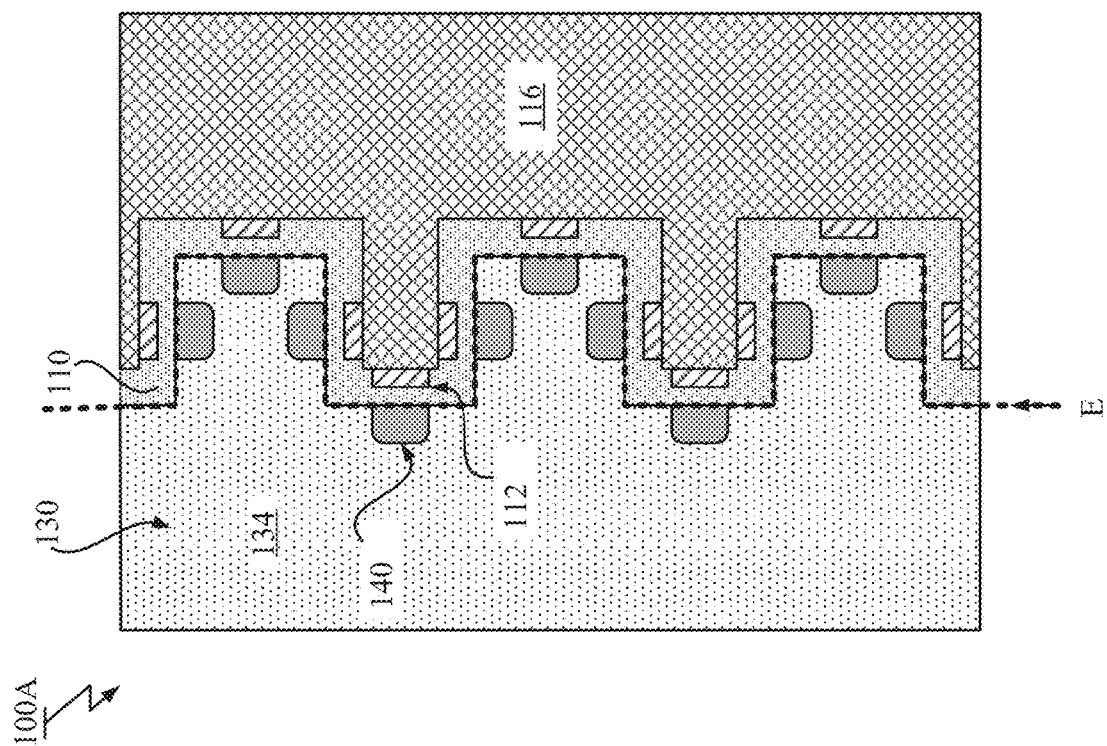
FIG. 21A illustrates a top view of an interconnection substrate without and with solder joints according to a particular embodiment of the present invention, respectively.

With reference to FIGS. 21A and 21B, a schematic of an interconnection substrate 100A according a particular embodiment of the present invention is described. FIG. 21A shows a top view of the interconnection substrate 100A without solder joints. FIG. 21B shows a top view of the interconnection substrate 100A with solder joints. As shown in FIGS. 21A and 21B, the edge E of the interconnection layer 130 has one or more angular shapes like a square waveform. The set of the side connection pads 140 are arranged along a contour of this square waveform like shape. Also accordingly, the edge of the solder resist layer 116 adjacent to the interconnection layer 130 also has one or more angular shapes like a square waveform. The set of the conductive pads 112 are also arranged along a contour of this square waveform like shape. Since the length of the edge E is extended by the amount of the bending in comparison with a case where the edge E has a straight shape, it is possible to increase the density of the side connections.

Figure 22B:
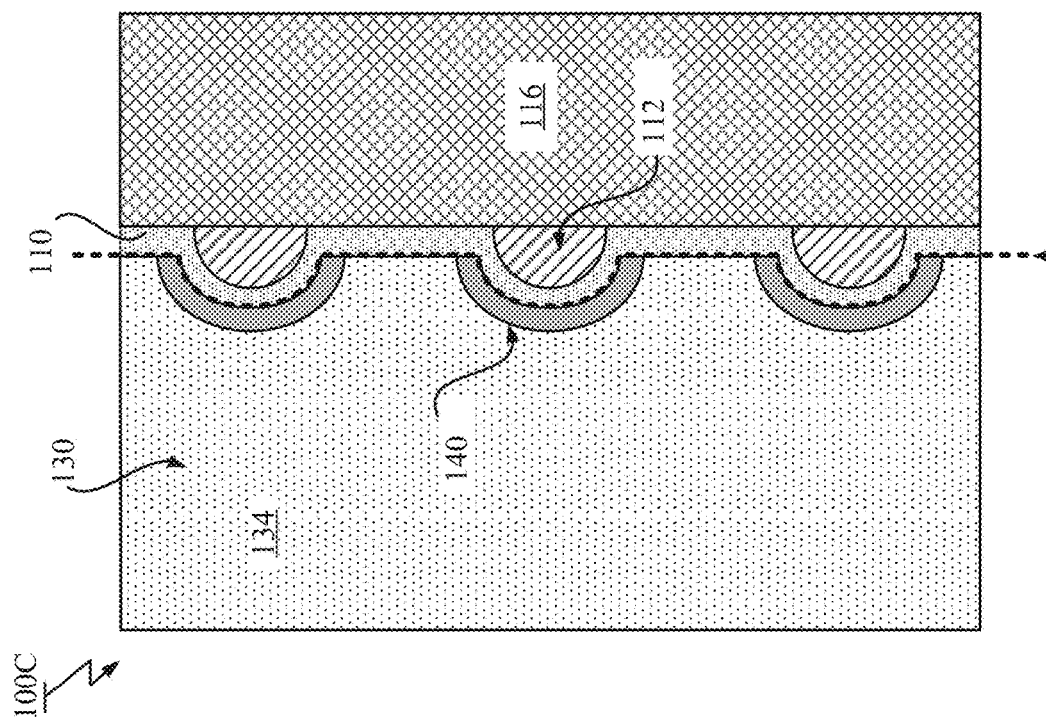
FIG. 22B illustrates a top view of interconnection substrates without solder joints according to other particular embodiments of the present invention.
Figure 22A:
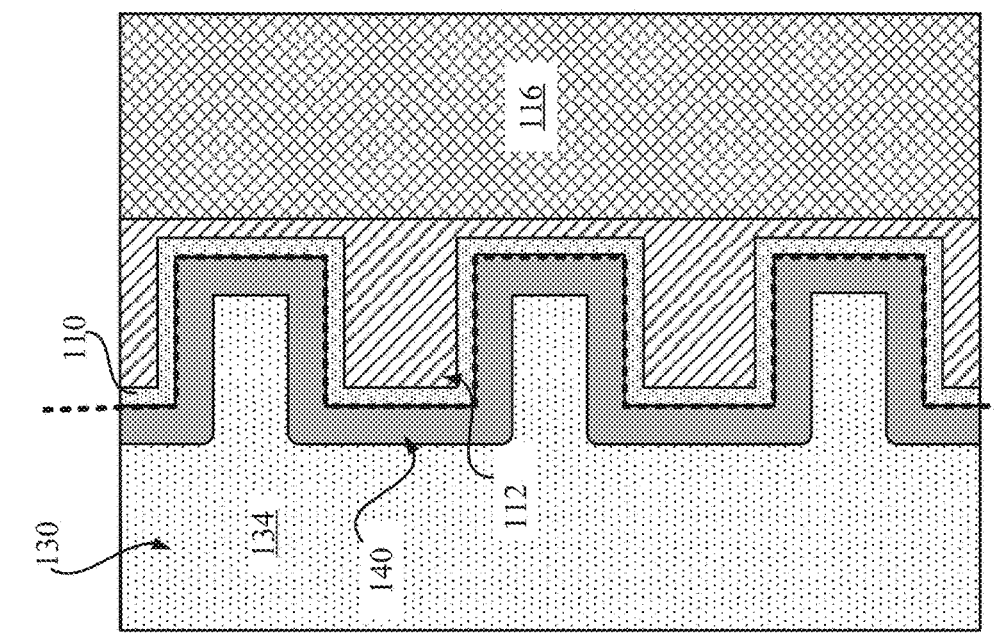
FIG. 22A illustrates a top view of interconnection substrates without solder joints according to other particular embodiments of the present invention.

With reference to FIG. 22A, a schematic of an interconnection substrate 100B according other particular embodiment of the present invention is described. FIG. 22A illustrates a top view of interconnection substrate 100B without solder joints. As shown in FIG. 22A, the edge E of the interconnection layer 130 has one or more angular shapes like a square waveform to extend the length of the edge E as similar to the embodiment shown in FIGS. 21A, 21B. The side connection pad 140 is formed along a contour of this square waveform like shape. Also accordingly, the conductive pad 112 is also formed along the contour of this square waveform like shape.

With reference to FIG. 22B, a schematic of an interconnection substrate 100C according further other particular embodiment of the present invention is described. FIG. 22B illustrates a top view of interconnection substrate 100C without solder joints. As shown in FIG. 22B, the edge E of the interconnection layer 130 has one or more curved shapes. The side connection pad 140 is formed along a contour of these curved shapes. The conductive pad 112 is also formed along a contour of these curved shapes.

In the interconnection substrates 100B, 100C, since the length of the edge E is extended by the amount of the bending, it is possible to increase contact areas for each side connection instead of increasing the density of the side connection.

The interconnection structure according to one or more embodiment of the present invention allows us to introduce a novel side connection between the conductive pad 114 of the organic base substrate 110 and the side connection pad 140 of the interconnection layer 130. Introduction of the novel side connection improves flexibility for routing of wiring with the interconnection layer 130. Thereby, it is possible to improve performance of an electronic device using the interconnection structure since the wiring can be optimized according to the improved routing flexibility. Also, it relaxes constraints on terminal layout of a chip that uses the interconnection layer 130.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An interconnection structure comprising:
   a support substrate;
   a release layer formed on the support substrate; and
   an interconnection layer part disposed on the release layer and having an edge, the interconnection layer part including:
      an insulation material, and
      a set of side connection pads embedded in the insulation material, the set of the side connection pads being located and exposed at the edge of the interconnection layer part and formed along the edge of the interconnection layer part with a predetermined interval.

2. The interconnection structure of claim 1, wherein each side connection pad has a bottom surface exposed at a bottom surface of the interconnection layer part and an edge surface exposed at the edge of the interconnection layer part.

3. The interconnection structure of claim 1, wherein each side connection pad is configured to be connected by a solder joint to a corresponding conductive pad disposed on a base substrate for receiving the interconnection layer part transferred thereto.

4. A method for fabricating an interconnection structure, the method comprising:
preparing a support substrate;
applying a release layer on the support substrate; and
building an interconnection layer part on the release layer, the interconnection layer part having an edge and including:
an insulation material, and
a set of side connection pads embedded in the insulation material, the set of the side connection pads being located and exposed at the edge of the interconnection layer part and formed along the edge of the interconnection layer part with a predetermined interval.

5. The method of claim 4, wherein building the interconnection layer part comprises:
patterning conductive material to provide the set of the side connection pads on the release layer; and
forming an insulation part on the release layer so as to embed the set of the side connection pads.

6. The method of claim 5, wherein building the interconnection layer part includes:
forming a set of first bond pads on the release layer;
patterning wiring configured to connect each side connection pad of the set of side connection pads with a corresponding bond pad of the set of first bond pads; and
forming a second insulation part to embed the wiring.

7. The method of claim 6, wherein building the interconnection layer part further includes:
forming a second bond pad and a third bond pad on the release layer;
patterning a trace for connecting the second bond pad and the third bond pad; and
forming a third insulation part to embed the trace.

8. The method of claim 5, further comprising: cutting the support substrate together with a structure on the support substrate through the patterned conductive material to complete the interconnection layer part and the set of the side connection pads.

9. The method of claim 5, wherein the insulation part is patterned so as to expose at least an edge surface of each side connection pad from the insulation parts, the method further comprising: cutting the support substrate at a position away from the set of the side connection pads.

* * * * *